US011955193B1

(12) United States Patent
Rumberg et al.

(10) Patent No.: US 11,955,193 B1
(45) Date of Patent: Apr. 9, 2024

(54) COMPUTE-IN-MEMORY ARRAY MULTI-RANGE TEMPERATURE COMPENSATION

(71) Applicant: ASPINITY, INC., Pittsburgh, PA (US)

(72) Inventors: Brandon David Rumberg, Pittsburgh, PA (US); Steven Andryzcik, Pittsburgh, PA (US)

(73) Assignee: ASPINITY, INC., Pittsburgh, PA (US)

( * ) Notice: Subject to any disclaimer, the term of this patent is extended or adjusted under 35 U.S.C. 154(b) by 0 days.

(21) Appl. No.: 18/529,303

(22) Filed: Dec. 5, 2023

(51) Int. Cl.
*G11C 27/00* (2006.01)
(52) U.S. Cl.
CPC .................. *G11C 27/005* (2013.01)
(58) Field of Classification Search
CPC .................................................... G11C 27/005
See application file for complete search history.

(56) References Cited

U.S. PATENT DOCUMENTS

| | | | | |
|---|---|---|---|---|
| 6,205,074 B1* | 3/2001 | Van Buskirk | .......... | G11C 5/145 365/189.09 |
| 7,057,958 B2* | 6/2006 | So | ............ | G11C 8/08 365/207 |
| 7,974,146 B2* | 7/2011 | Barkley | ................ | G11C 16/30 365/230.06 |
| 9,245,642 B1* | 1/2016 | Chen | ................... | G11C 16/0483 |
| 10,755,783 B2* | 8/2020 | Tran | ........................ | G06F 17/16 |

* cited by examiner

*Primary Examiner* — Son L Mai
(74) *Attorney, Agent, or Firm* — Buckley, Maschoff & Talwalkar LLC

(57) ABSTRACT

According to some embodiments, a memory controller may be provided. A compute-in-memory array may be connected to a plurality of word lines of the memory controller, with multiple word lines per word being associated with different temperature coefficients, to facilitate temperature compensation of the compute-in-memory array. In some embodiments, the compute-in-memory array may be associated with parameter floating-gate transistors. Moreover, a plurality of compute-in-memory arrays may be individually programmed to several orders of parameter magnitude.

22 Claims, 27 Drawing Sheets

COMPUTE-IN-MEMORY ARRAY MULTI-RANGE TEMPERATURE COMPENSATION

FIELD

Some embodiments are associated with temperature compensation. More specifically, some embodiments provide compute-in-memory array multi-range temperature compensation.

BACKGROUND

Analog circuitry may be provided to perform various applications. For example, analog circuitry might analyze information from a sensor network for a variety of tasks including, e.g., monitoring critical infrastructures such as bridges or monitoring vital signs in biomedical applications. Moreover, programmable circuit elements composed of analog Non-Volatile Memory ("NVM") cells may control parameters of analog circuitry to achieve application-based programmability. Furthermore, analog NVM cells may be utilized to control analog parameters across many orders of magnitude, e.g., enabling a filter frequency to be adjusted from 1 Hz to 1 MHz. Achieving such a wide range of control with a single NVM cell enables efficient use of space and power across a wide range of applications. However, such a wide range of control may introduce strong temperature dependence as devices will operate across a wide range of current densities. While several types of analog NVM cells exist, such as floating-gate transistors (i.e., Flash), Phase-Change Memory ("PCM"), Resistive Random-Access Memory ("ReRAM"), and Spin-Transfer Torque Magnetic Random-Access Memory ("STT-MRAM"), consider floating-gate transistors for illustration. By connecting the floating-gate transistor's control gate to a constant voltage, the drain current of the floating-gate transistor can act as a programmable current source. Adding or removing charge to the transistor's isolated floating gate node allows for direct control of the transistor's drain current across many orders of magnitude. Note, however that this drain current may be temperature-dependent as a floating-gate transistor has the same process, voltage, and temperature characteristics as a standard Metal-Oxide-Semiconductor Field-Effect Transistor ("MOSFET").

"Temperature Compensation of Floating-Gate Transistors in Field-Programmable Analog Arrays" (Diello, et. al IEEE International Symposium on Circuits and Systems ("ISCAS") 2017) discloses an approach that creates a reference circuit that can adaptively adjust the control gate of a "parameter" floating-gate transistor to keep the output current relatively constant with varying temperature, so long as the charge on the floating-gate transistor is constrained to a narrow range of values that can be effectively temperature-compensated by the reference circuit. If the charge on the parameter floating-gate transistor exceeds the effective compensation range, the output current will vary more with temperature.

In that reference circuit, a second "reference" floating-gate transistor is programmed to store a specific amount of charge on its floating-gate node. It is diode-connected (via drain and control-gate) and has a current sink connected to its drain to generate a voltage. If the current sink is temperature-independent, the control-gate/drain voltage of the reference floating-gate varies linearly with temperature. This node voltage may be applied to a control gate of a parameter floating-gate transistor (that would supply a current to a circuit—e.g., a programmable current source). When the two floating-gate transistors have similar programmed charge on their respective floating-gate nodes, the parameter floating-gate transistor's current will result in a largely temperature insensitive current source.

Such an approach may work well under the constraint that the two floating-gate nodes have nearly identical programmed charges. If the programmed charges are substantially different, then the output current will be very sensitive to temperature. Put another way, if the parameter floating-gate transistor supplies a current that is substantially different from the reference current that biases the reference floating-gate transistor, then the output current will be temperature sensitive.

Prior approaches use one reference floating-gate transistor operating at one reference current to generate a temperature-dependent bias voltage for all parameter floating-gate transistors on the chip. However, not all parameter floating-gate transistors will have output currents that are similar to the reference current (based on the needs of an application developed, particularly in a reconfigurable analog system). As a result, many of the generated currents will have unacceptable temperature sensitivity. The greater the difference between the reference current and output current, the greater the temperature sensitivity. This poses significant problems with reconfigurable applications for which current values could vary over several orders of magnitude. Note that typically only one (or a few) temperature-independent current sources are available on-chip due to area and power considerations (and design challenges of building temperature-independent references). Therefore, it is not feasible to have a dedicated temperature-independent current reference and reference floating-gate transistor for every parameter floating-gate transistor current on chip.

Beyond using floating-gate transistors to create arrays of programmable current sources, various types of analog NVM cells may be used to program properties like charge and conductance to control circuits via current, resistance, or voltage. NVM cells may thereby parameterize analog computing circuits or they may hold analog model parameters in a compute-in-memory array. Regardless, the temperature coefficient of the parameter may be a function of the parameter, with greater temperature sensitivities encountered for a wider range of parameter values.

Accordingly, methods and mechanisms for accurately and efficiently providing temperature compensation may be desired. In particular, it may be desirable to create a multiplicity of programmable circuit elements using analog NVM cells that are temperature insensitive over several orders of magnitude of parameter values.

DETAILED DESCRIPTION

Disclosed herein are various examples related to re-programmable and/or reconfigurable analog signal processing. Note that embodiments described in this disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Figure 1A:
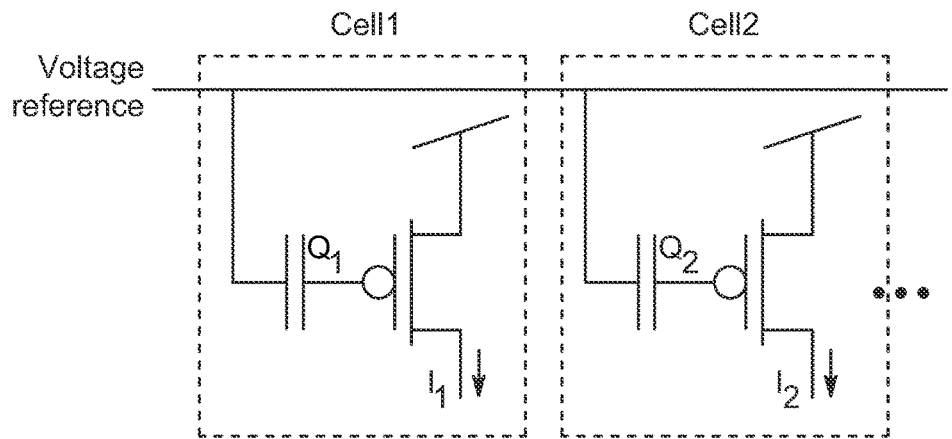
FIGS. 1A and 1B are associated with an array of parameter floating-gate transistors without a temperature compensated control line.
Figure 1B:
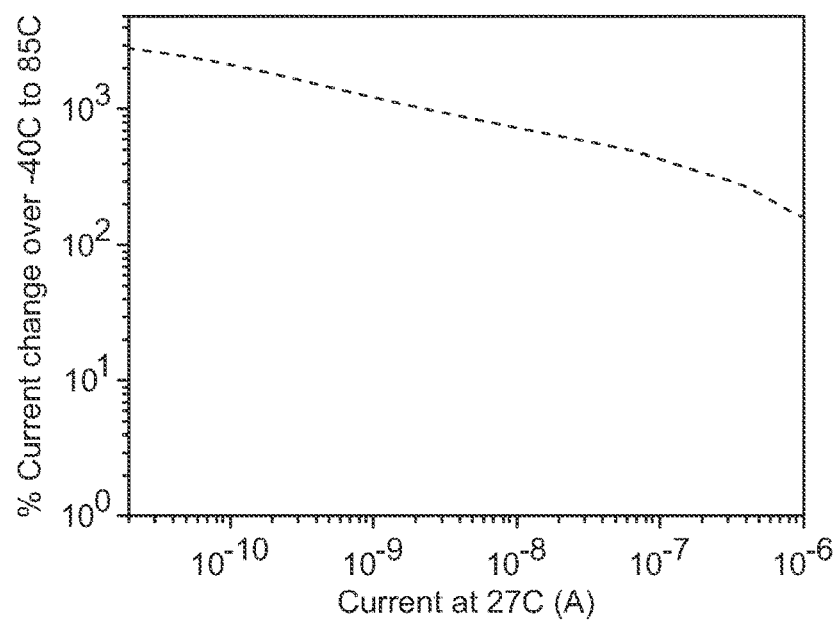

It should also be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'". FIGS. 1A and 1B are associated with an array of analog parameter NVM consisting of floating-gate transistors without a temperature compensated control line. In particular, FIG. 1A is a circuit 110 in which all floating-gate drain currents ($I_1$, $I_2$, . . . ) vary strongly with temperature. This temperature variation is illustrated 120 in FIG. 1B, which shows typical percent change across a −40° C. to 85° C. temperature range. When the floating-gate drain currents are used to perform analog computation or to bias analog circuit parameters, such as gains or time constants, that may require a wide range of current values to obtain the desired circuit parameter, the temperature variation in FIG. 1B significantly alters performance.

Figure 2A:
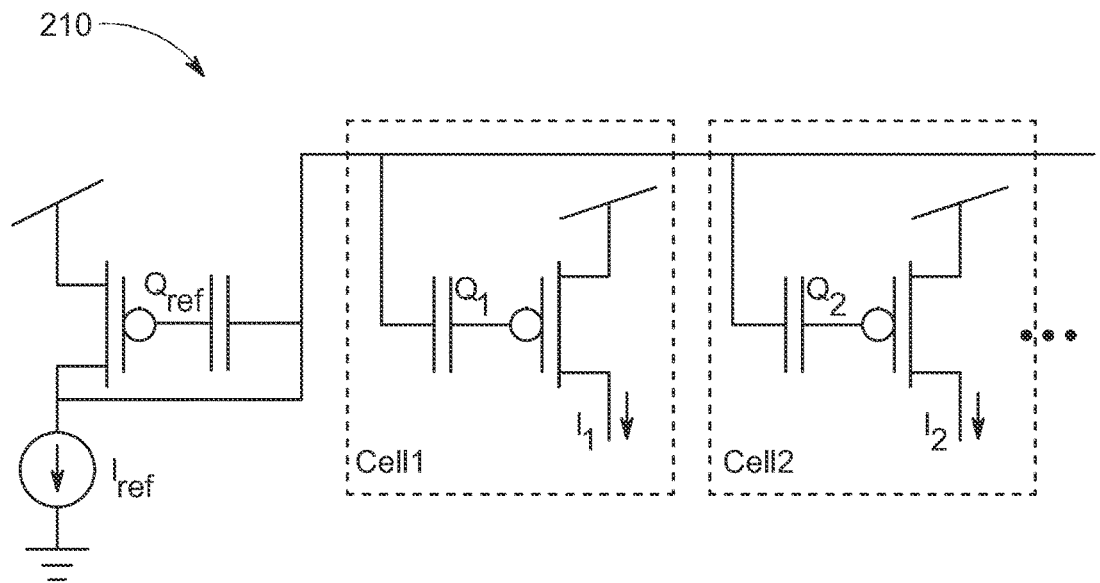
FIGS. 2A, 2B, and 2C are associated with an array of parameter floating-gate transistors having a single temperature-compensated control line.
Figure 2B:
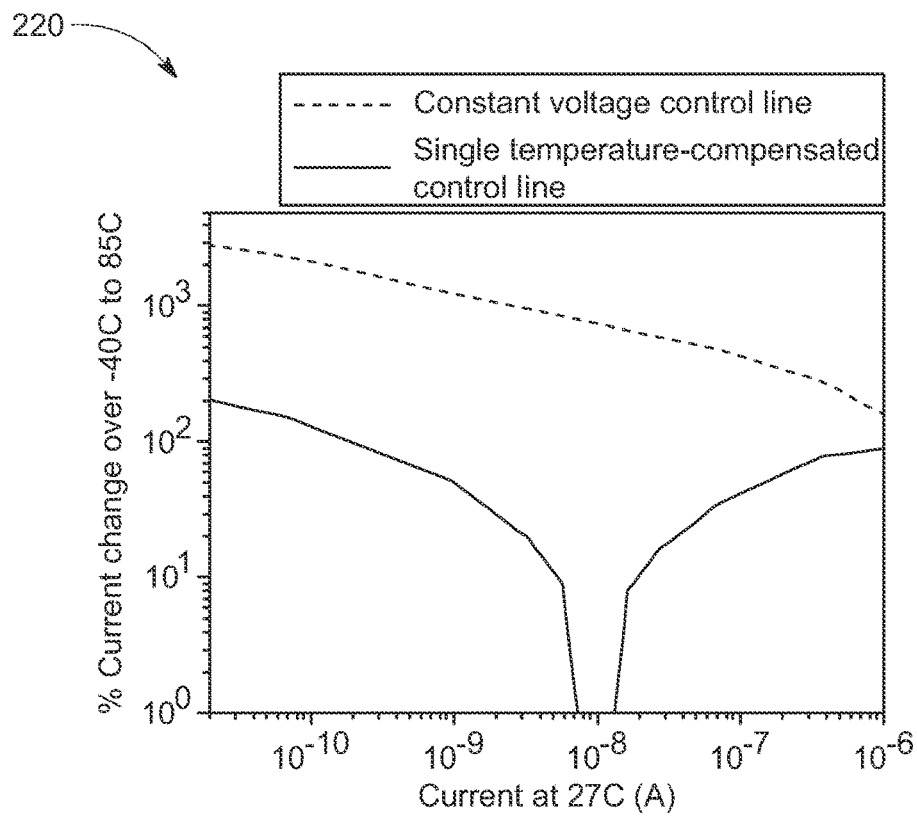
Figure 2C:
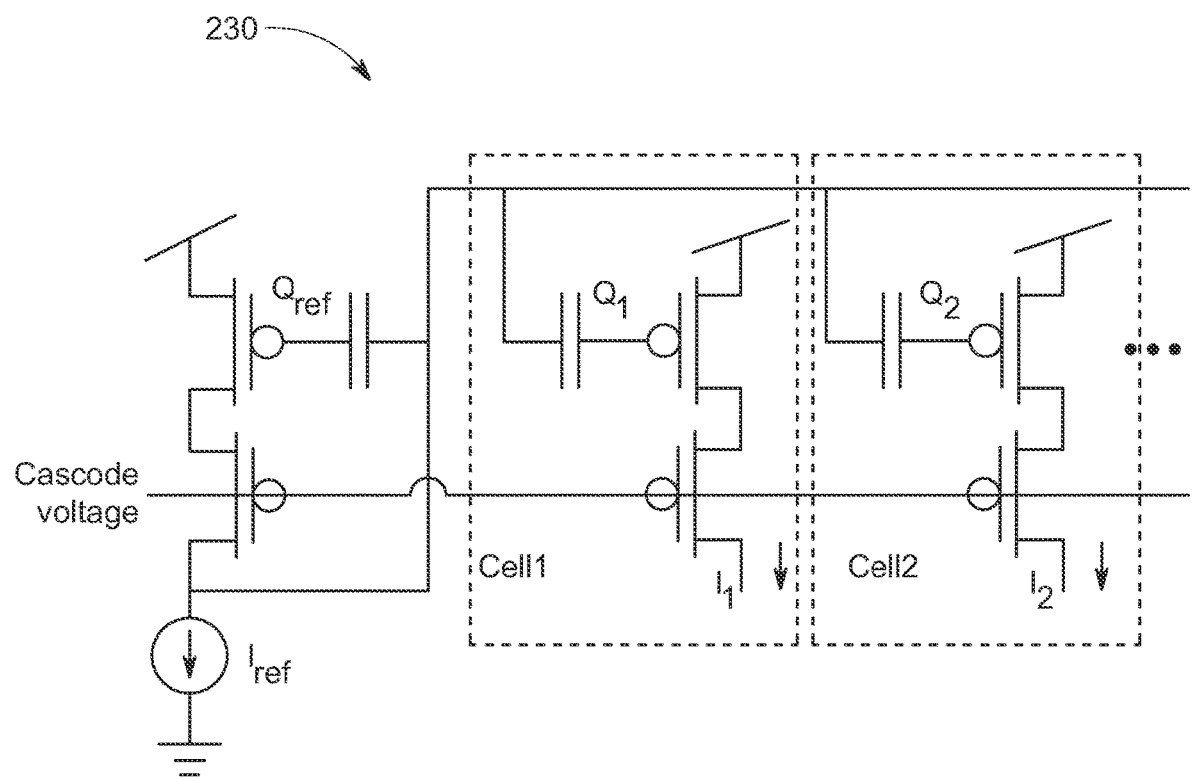

FIGS. 2A, 2B, and 2C are associated with an array of analog parameter NVM consisting of floating-gate transistors having a single temperature-compensated control line. In the circuit 210 of FIG. 2A, a reference circuit induces a linear temperature coefficient onto the control line such that parameter floating-gate transistors in Cell1, Cell2, . . . with a charge approximately equal to $Q_{ref}$, which implies that the parameter floating-gate transistor was programmed to supply approximately $I_{ref}$ as a drain current, will be effectively temperature compensated. However, devices that are programmed to much different charge will have an exceedingly worse temperature dependence.

This charge-/target-dependence over temperature is illustrated 220 in FIG. 2B. In this example, $I_{ref}$=10 nA, so devices that are programmed to be close to 10 nA have their temperature dependence canceled. Devices that are far from the reference current are much improved versus the circuit 110 of FIG. 1A but can still vary by a factor of 2-3× across −40° C. to 85° C. In practice, for any of the variants described, a cascode arrangement may be desirable to minimize temperature dependence caused by voltage changes at the drain. For example, FIG. 2C is a circuit 230 in which a cell may connect to a temperature-dependent load that modulates the drain voltage. The cascode device in the cell isolates the drain of the floating-gate transistor from this voltage modulation, which would otherwise couple onto the floating gate node, causing the drain current to change even more with temperature.

Figure 3:
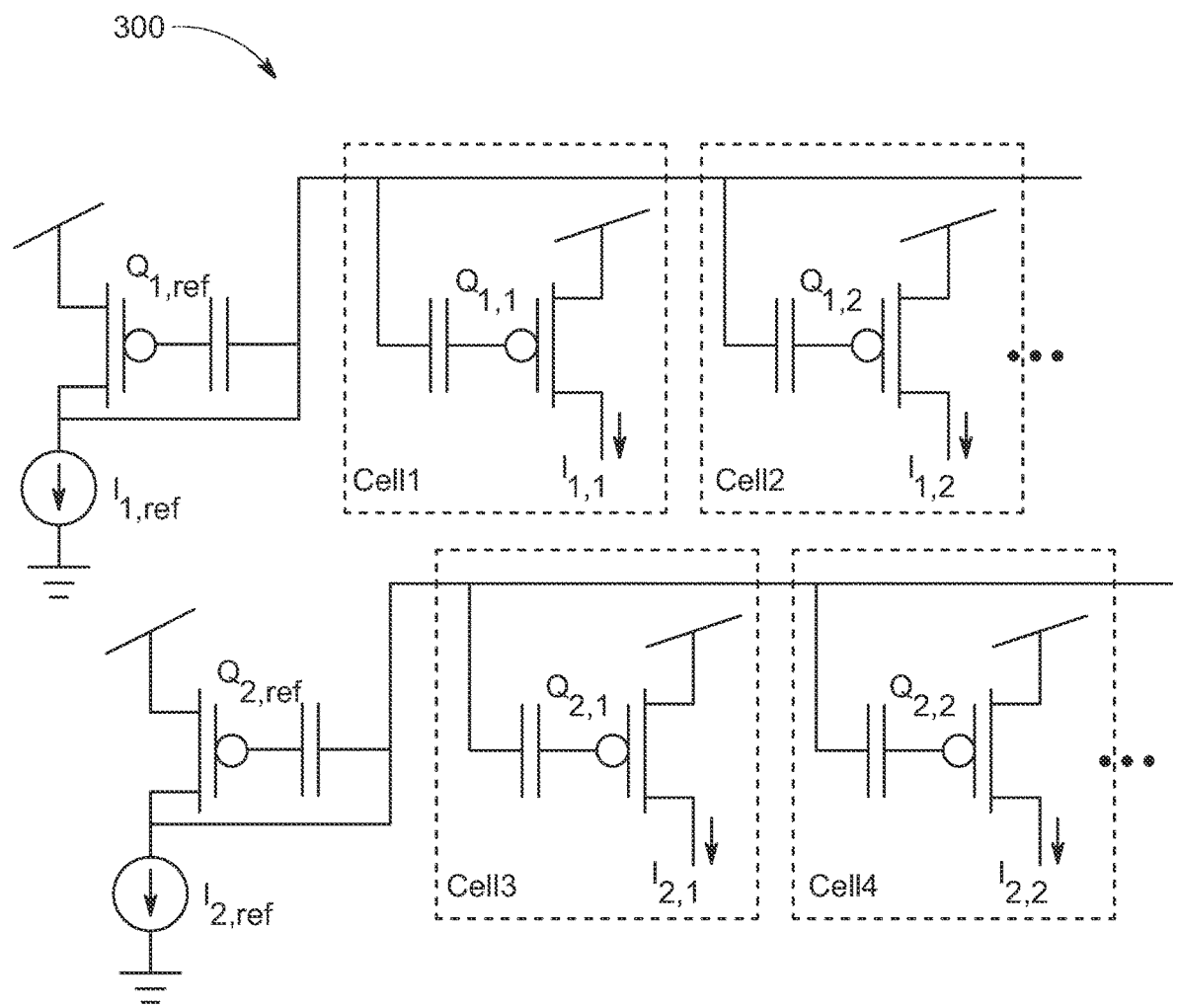
FIG. 3 is a circuit having multiple control lines with temperature profiles dedicated to different operating ranges according to some embodiments.

FIG. 3 is a circuit 300 having multiple control lines, each with temperature profiles dedicated to different operating ranges according to some embodiments. This may comprise a specific variant of the embodiment described in connection with FIGS. 4A and 4B. Since parameter floating-gate transistors in the circuit 210 of FIG. 2A are only temperature compensated effectively if they have similar charge, temperature compensation over a wide range of target currents may be achieved by using multiple reference devices with a range of operating points. Each reference device can enforce a different temperature profile on a unique control line. Devices can be wired to the control line of the reference that is closest to their target range. This allows each device to be temperature compensated over a small range of parameters. For example, $I_{1,ref}$ might be 1 nA and $I_{2,ref}$ might be 10 nA. As a result, an appropriate range for Iv would be 300 pA to 3 nA, and an appropriate range for $I_{2,*}$ would be 3 nA to 30 nA.

Figure 4A:
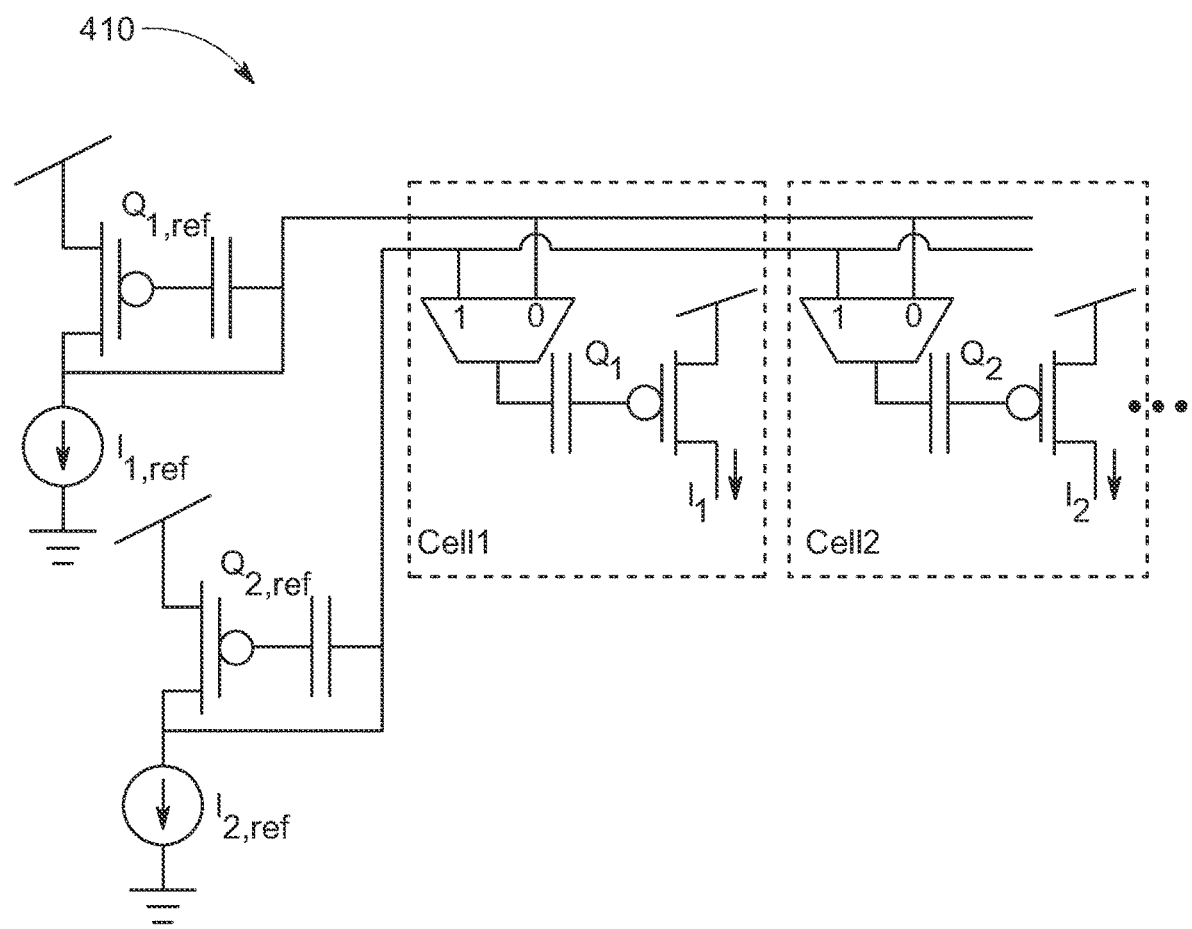
FIGS. 4A and 4B are associated with a selectable set of control lines with different temperature profiles in accordance with some embodiments.
Figure 4B:
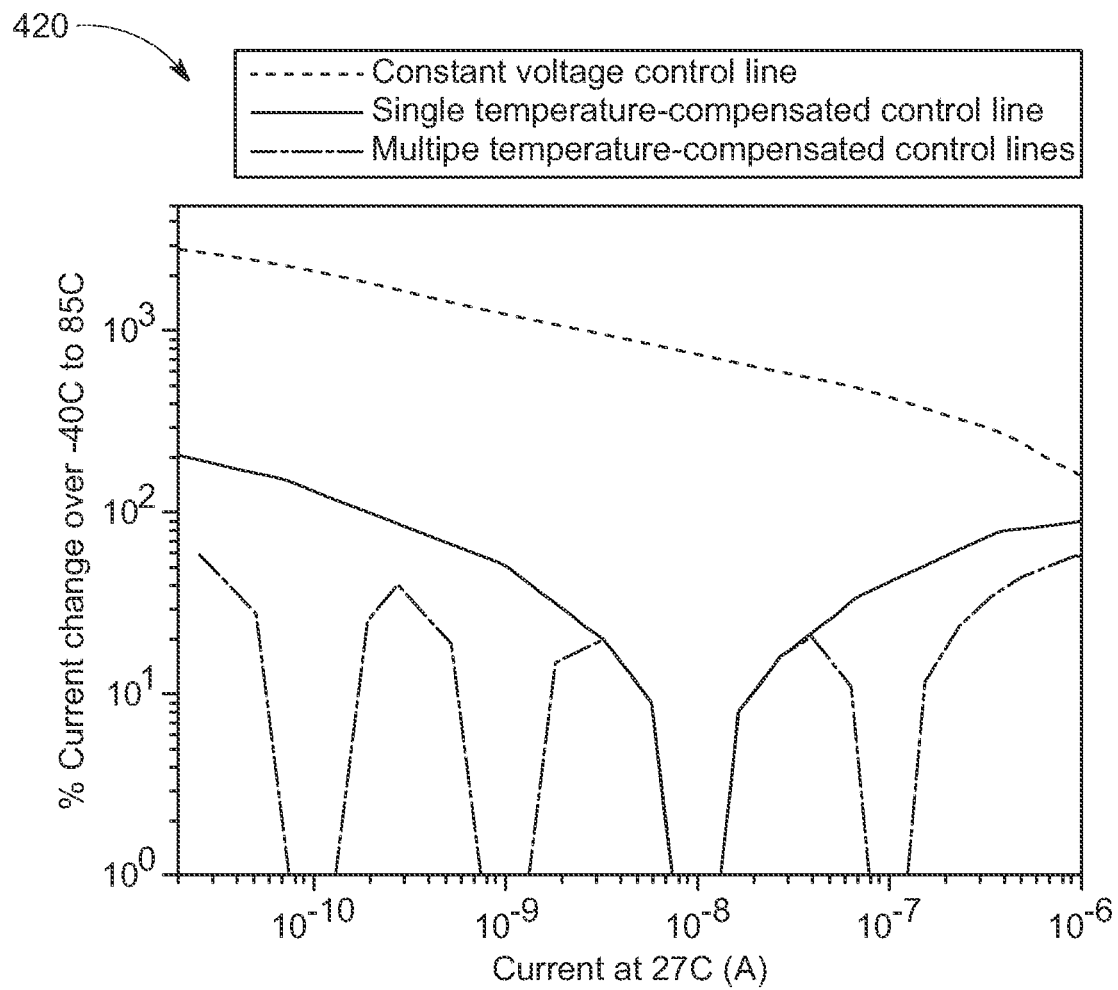

FIGS. 4A and 4B are associated with a selectable set of control lines with different temperature profiles in accordance with some embodiments. In particular, FIG. 4A is a circuit 410 in which multiple references are again used to generate a set of control lines that provide different temperature profiles for different operating points. But to enable the largest range of programmed parameters that can be temperature compensated, each parameter floating-gate device in the array may have the option of connecting to any of the control lines. At configuration time, each parameter floating-gate device in the array is assigned to the control line that is closest to the desired operating point, and then the charge for that device is set relative to the corresponding reference such that the floating-gate transistor supplies the desired output.

The impact of multiple control lines is illustrated 420 in FIG. 4B, where there are four references operating at 100 pA, 1 nA, 10 nA, and 100 nA. When using a target value near one of those reference values, the output is temperature compensated. When using a value in between the reference values, the output is also improved—the worst-case is reduced from 200% for a single control line to 60% for four control lines.

Figure 5:
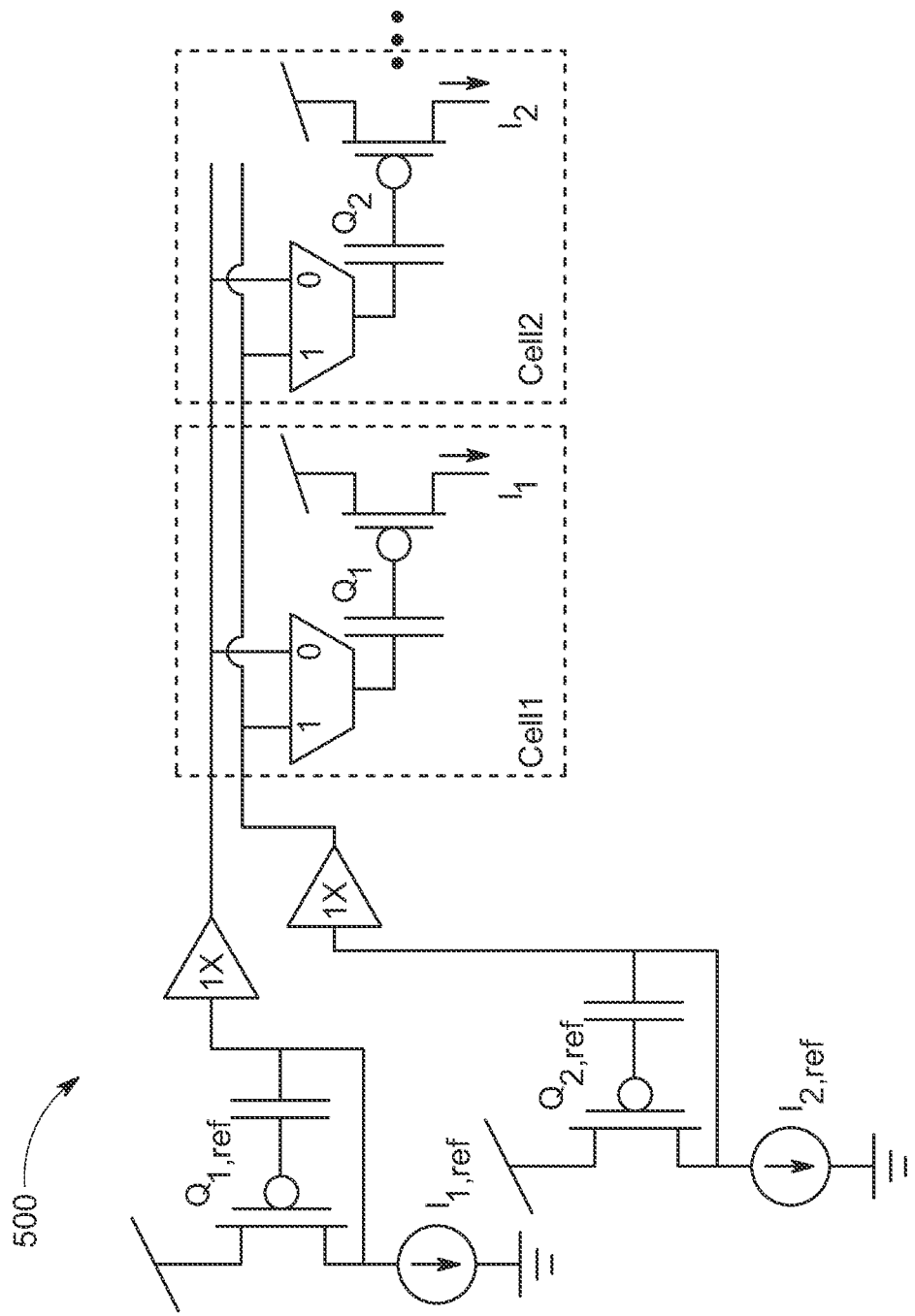
FIG. 5 is a circuit that buffers references from high-temperature switch leakage according to some embodiments.
Figure 16:
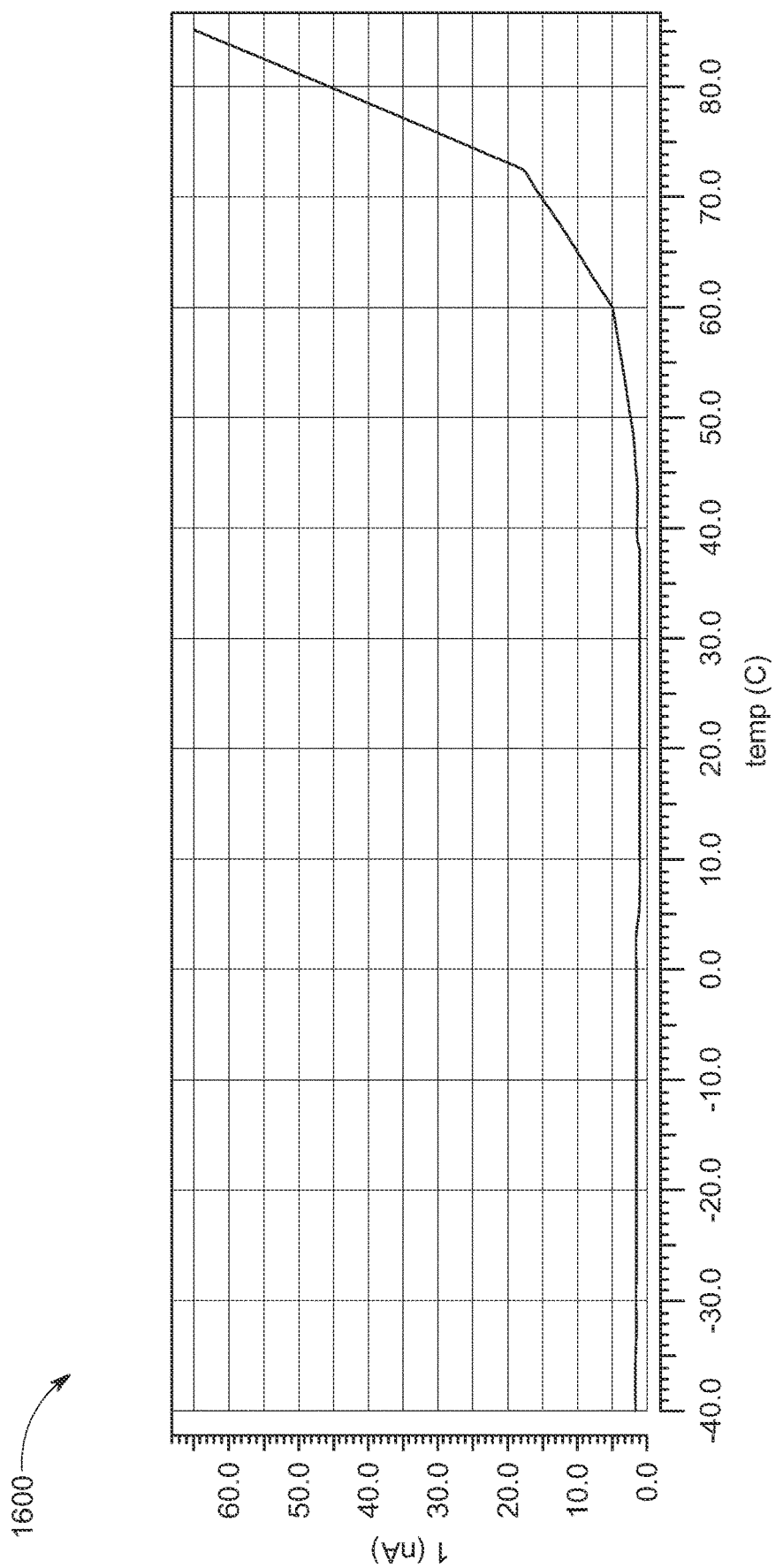
FIG. 16 is a graph showing switch leakage current over temperature in accordance with some embodiments.

FIG. 5 is a circuit 500 that buffers references from high-temperature switch leakage according to some embodiments. FIG. 16 illustrates the rise in leakage current at high operating temperature. Note that at higher temperatures the switches in the multiplexers will draw increasingly higher leakage currents. If the reference currents ($I_{1,ref}$ and $I_{2,ref}$) are low compared to the leakage currents of the switches, then the corresponding control lines will be modulated by high temperatures as a result of this leakage. To prevent switch leakage from impacting the references, buffers may be inserted between the references and the switch array.

Figure 6A:
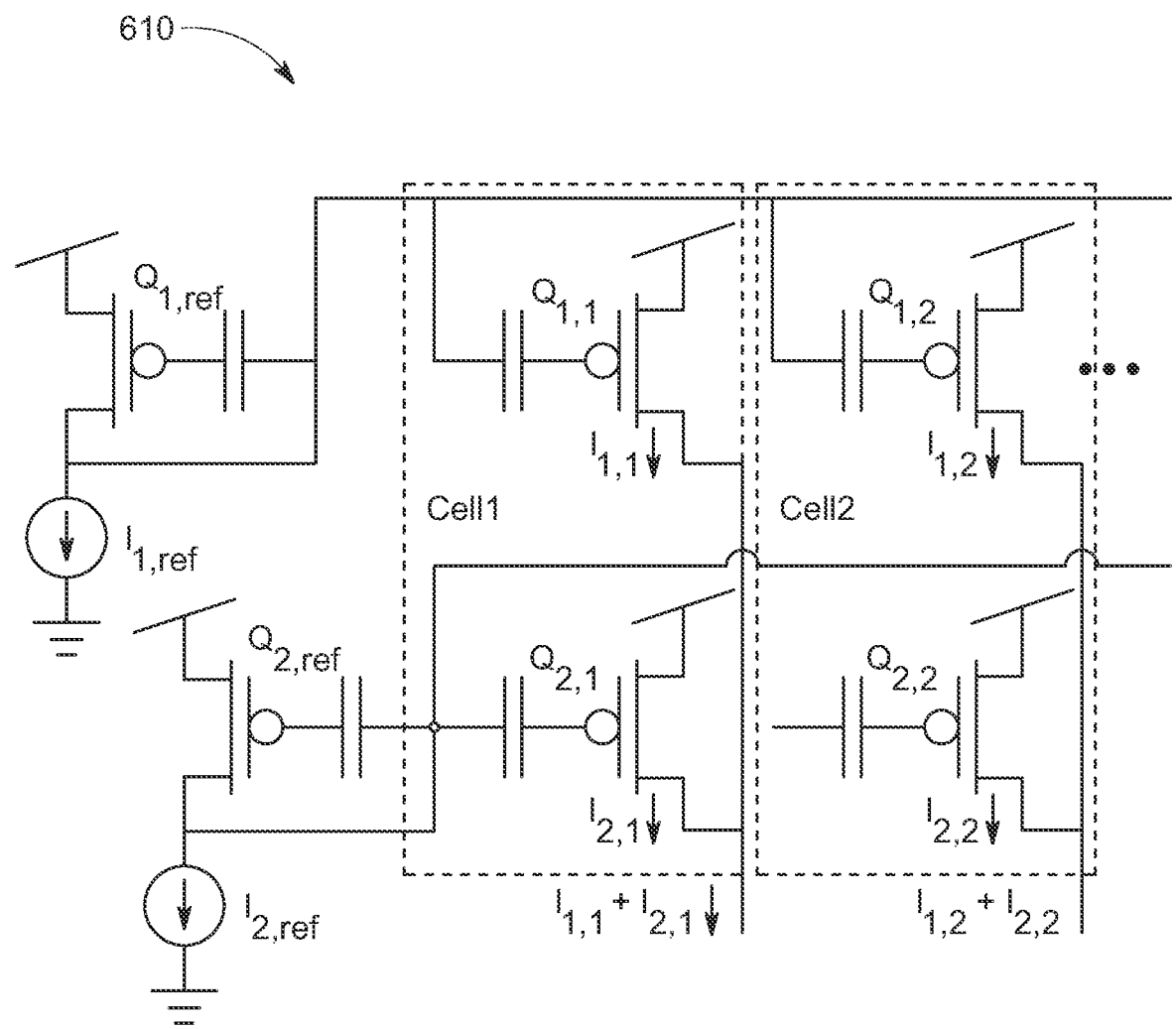
FIGS. 6A and 6B are associated with combining temperature profiles from a set of control lines in accordance with some embodiments.
Figure 6B:
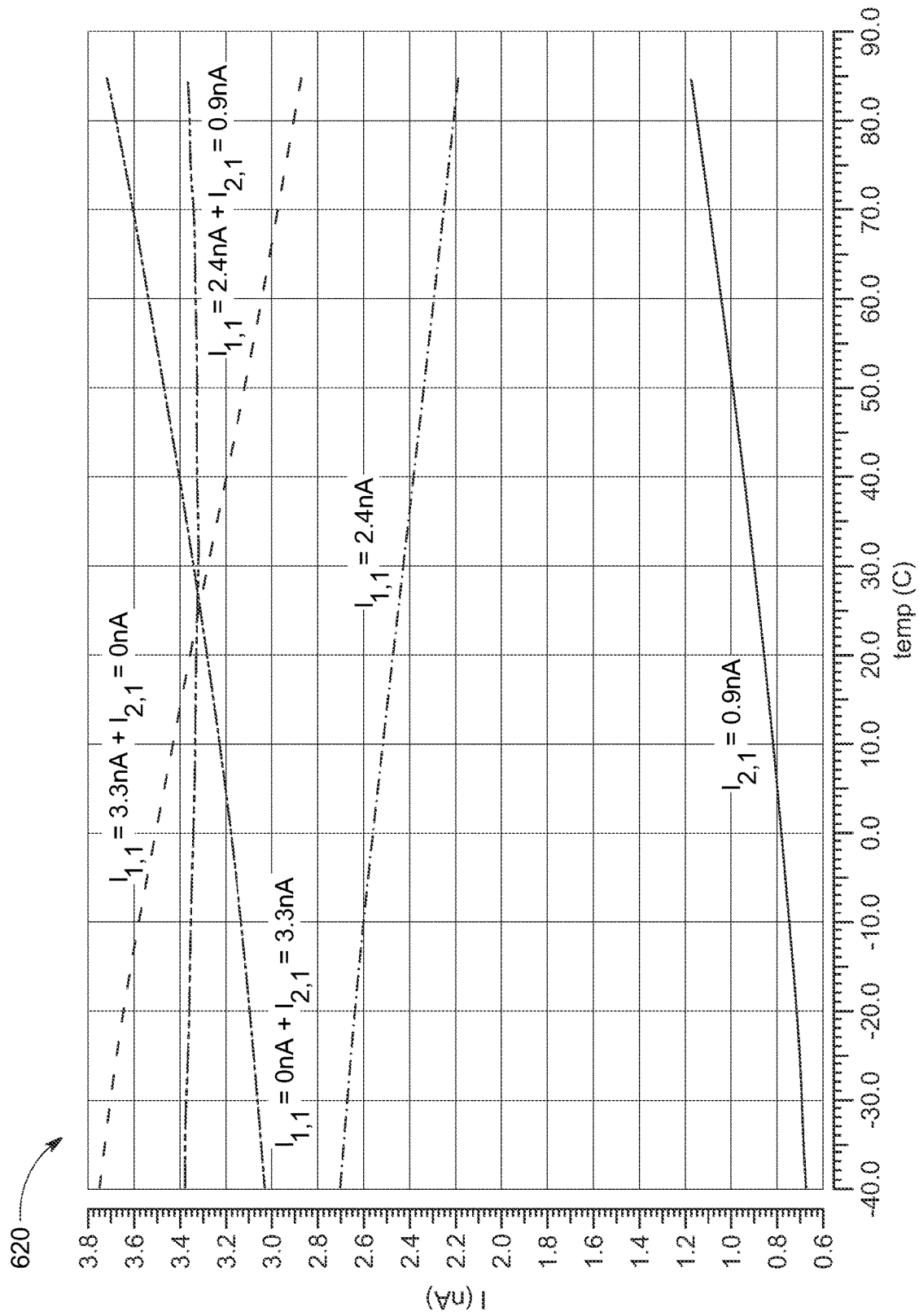

FIGS. 6A and 6B are associated with combining temperature profiles from a set of control lines in accordance with some embodiments. The circuits 300, 410 may select the best temperature profile from a set of control lines to connect to a single floating-gate transistor in the cell. Alternatively, each cell may contain multiple floating-gate transistors (specifically, one for each control line). In the simplest usage, only one of the floating-gate transistors in each memory cell might be programmed at a given time, effectively replicating the functionality of FIG. 4A. For example, if cell 1's desired parameter is closest to reference 1, then $Q_{1,1}$ would be programmed to the necessary charge, $Q_{2,1}$ would be left erased, and the resulting combined current would just be $I_{1,1}$.

Beyond this simplest usage, all floating-gate transistors in a cell may be programmed such that they generate currents with opposing temperature coefficients to better cancel the temperature dependence when operating in the regions between the references. This is illustrated 620 in FIG. 6B where $I_{1,ref}=1$ nA and $I_{2,ref}=10$ nA, and the target current is equidistant between the references at 3.3 nA.

"$I_{1,1}=3.3$ nA+$I_{2,1}=0$ nA" and "$I_{1,1}=0$ nA+$I_{2,1}=3.3$ nA": if a single control line and single device are used, then at the equidistant target, they have temperature coefficients that are opposite in sign but essentially equal in magnitude. In fact, the sign is determined by whether the target is greater than or less than the reference.

The floating-gate transistors within the memory cell can both be programmed such that their currents sum to the desired target and cancel the temperature dependence. Here, $I_{1,1}$ is programmed to 2.4 nA, $I_{2,1}$ is programmed to 0.9 nA, and the resulting sum has only 1.6% total change from −40° C. to 85° C.

Figure 7:
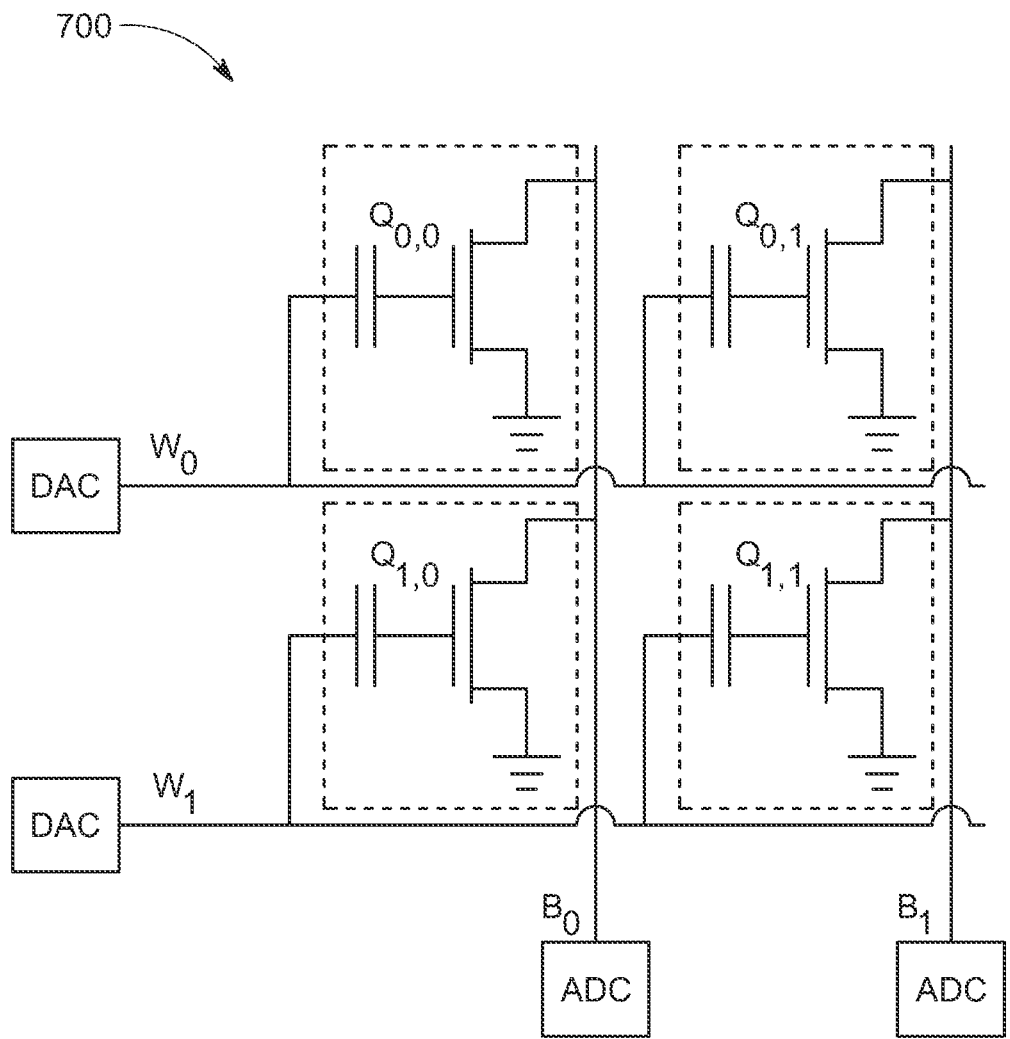
FIG. 7 is a circuit with a floating-gate based analog compute-in-memory array.

Analog compute-in-memory systems may utilize a crossbar of analog memory elements to perform multiply-accumulate operations. For example, FIG. 7 is a circuit 700 with a floating-gate based analog compute-in-memory array. Various types of analog memory elements may be used, such as analog Flash (e.g., floating-gate transistors), Phase-Change Memory ("PCM"), and Resistive RAM ("ReRAM"). The Flash-based implementation of the circuit 700 is constructed as a common NOR Flash configuration, but the way it is used causes vector-matrix multiplication to be performed during a read operation. Specifically:

The floating-gate devices are programmed with analog charge levels (e.g., approximating the magnitude of an 8-bit signed integer by programming a range of 0-127). As a result, the floating-gate transistor effectively multiplies a stored value by the voltage on the word line (W*).

Multiple word lines (W*) are driven simultaneously such that multiple floating gates on the same bit line (B*) are activated simultaneously. The currents from these floating gates are accumulated based on Kirchoff's current law. In effect, the current on the bit line is the dot product between the word line values and the weight values in the column.

The word lines (W*) are driven with analog values such that a row is not simply on or off, but is instead turned on by fractional amount. "Driving with analog values" may mean encoding the value as a voltage using a DAC as shown in the circuit 700 or may mean encoding the value as a pulse duration using a digital-to-time converter.

Because the weight values stored on the floating-gate transistors should cover a moderate range of values (generally at least two orders of magnitude), the same temperature dependence described with respect to FIG. 1A is encountered. Readings from a temperature sensor may be used to remap the value that is applied to the word line such that temperature compensation is achieved only for a small range of values, as in FIG. 2A.

Figure 8:
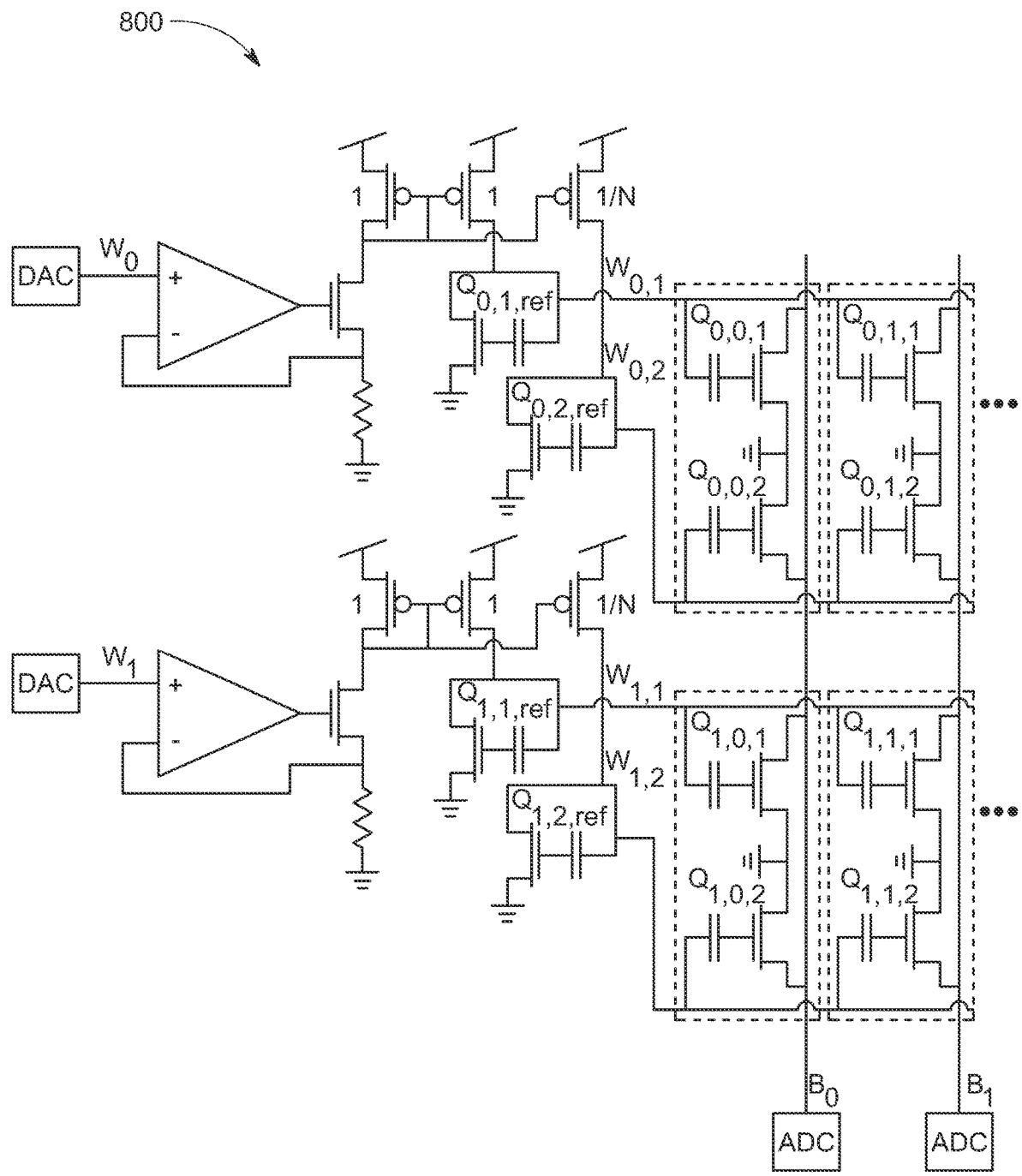
FIG. 8 is a circuit with a temperature compensated analog compute-in-memory array according to some embodiments.

While any of the embodiments described herein may be applied to analog compute-in-memory arrays, FIG. 8 is a circuit 800 with a temperature compensated analog compute-in-memory array according to a specific embodiment. Each memory cell has two floating-gate transistors and two word lines. The word lines are ratioed to different operating points to provide different temperature profiles. The cells are programmed to store weights. There are two basic options for mapping the weights into the cells: 1) only the floating-gate transistor corresponding to the word line with the closest temperature coefficient to the weight is programmed and the other floating-gate transistor is not programmed (equivalent to FIG. 4A), or 2) the weight is split across the floating-gate transistors to implement opposing temperature coefficients for more accurate temperature compensation over a wider range of weights (equivalent to FIG. 6A).

In contrast to some embodiments (where the control lines are biased for a fixed value), usage in a compute-in-memory framework may require dynamically changed control (i.e., word) lines based on the operation being performed. A possible scheme for this is shown in the left-side input path of the circuit.

The Digital-to-Analog Converter ("DAC") generates a voltage that is converted to a current by the combination of the opamp, resistor, and n-type Field Effect Transistor ("NFET"), representative of standard unipolar voltage-to-current conversion.

The current is ratioed by N to create two operating points. These define the different temperature coefficient points for the word lines.

Each of the currents is converted to a word line via a diode-connected floating-gate transistor.

The temperature compensation mechanisms may otherwise be as described in other embodiments.

Instead of having a single reference floating-gate transistor whose control-gate voltage fans out to all parameter floating-gate transistors on a chip, some embodiments described herein contain multiple different reference floating-gate transistors. Each of the reference floating-gate transistors are biased for different operating ranges or temperature coefficients. The parameter floating-gate transistor's control gate can then be connected to the reference floating-gate that most closely matches the desired output charge/currents. As a result, a wider range of currents can have temperature-insensitive properties.

Figure 9A:
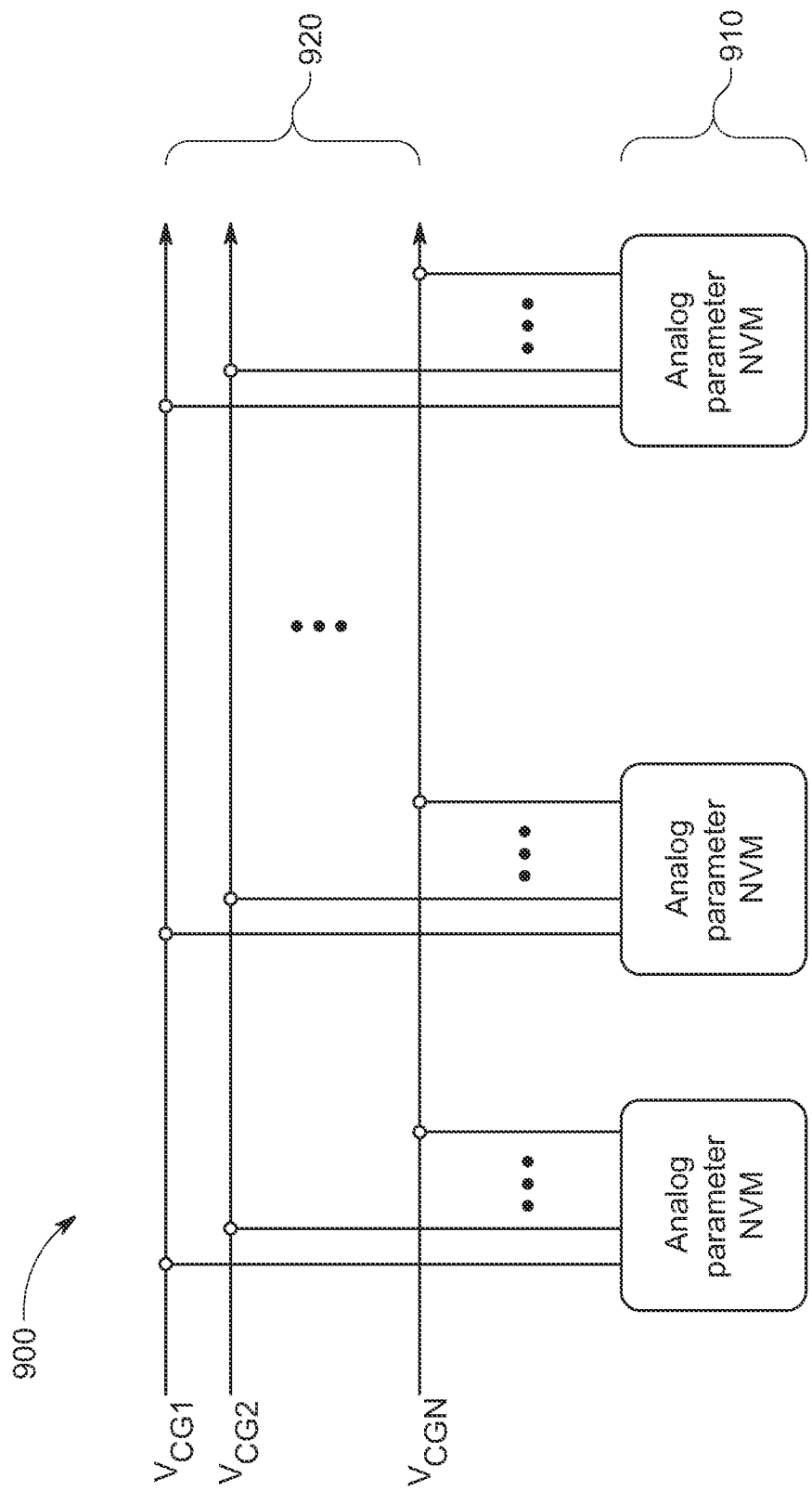
FIGS. 9A, 9B, and 9C are high-level block diagrams illustrating system architectures according to some embodiments.

FIG. 9A is a high-level block diagram illustrating an architecture of a system 900 according to some embodiments. The system 900 may be associated with re-programmable and/or reconfigurable analog circuitry such as a Field-Programmable Analog Array ("FPAA") (e.g., an integrated circuit device that contains computational analog blocks and interconnects between the blocks to offer field-programmability). According to some embodiments, the system 900 includes a plurality of analog parameter NVM 910 (analog parameter NVM 1 through N) each configurable to be connectable to a plurality of global reference control lines 920 ($V_{CG1}$ through $V_{CGN}$) of the analog circuitry to facilitate temperature compensation. The analog parameter NVM may be associated with, for example, floating-gate transistors.

According to some embodiments, the plurality of parameter floating-gate transistors 910 cover several orders of current magnitude and are each programmed to different amounts of charge. Moreover, a software toolchain at compilation time may select which parameter floating-gate transistor 910 is connected to which global reference control line 920 and/or a current value for each parameter floating-gate transistor 910. In addition, the global reference control lines 920 may comprise a control-gate voltage ($V_{CG}$) biasing block that includes, for example, an array of four reference floating-gate transistors each having a gate and drain that are connected in run-time mode to switchable current sinks such that they can be biased at different values. Note that two different parameter floating-gate transistors 910 might be connected to the same $V_{CG}$ in some embodiments. Moreover, analog compute-in-memory arrays may be compensated to account for variations associated with temperature. In addition, the analog compute-in-memory arrays may require dynamic control defined by the temperature coefficient points for the connected word lines.

In some embodiments, the analog circuitry includes reference NVMs and a plurality of parameter NVMs with programmed, compensated biases. The biases may be continuously tuned (e.g., in a loop) to compensate for circuit-specific variations associated with temperature. Moreover, configuration parameters may be computed by iterating over all bias combinations, calculating a temperature coefficient for a plurality of parameters, and selecting the combination that minimizes the maximum temperature coefficient. In addition, a reference floating-gate transistor 910 may be buffered before connecting to switches that allow for temperature compensation reference selection. Note that bias calibration may be performed with these buffers in the loop to account for offset introduced by the buffers when a primary reference's charge is modified.

Figure 9B:
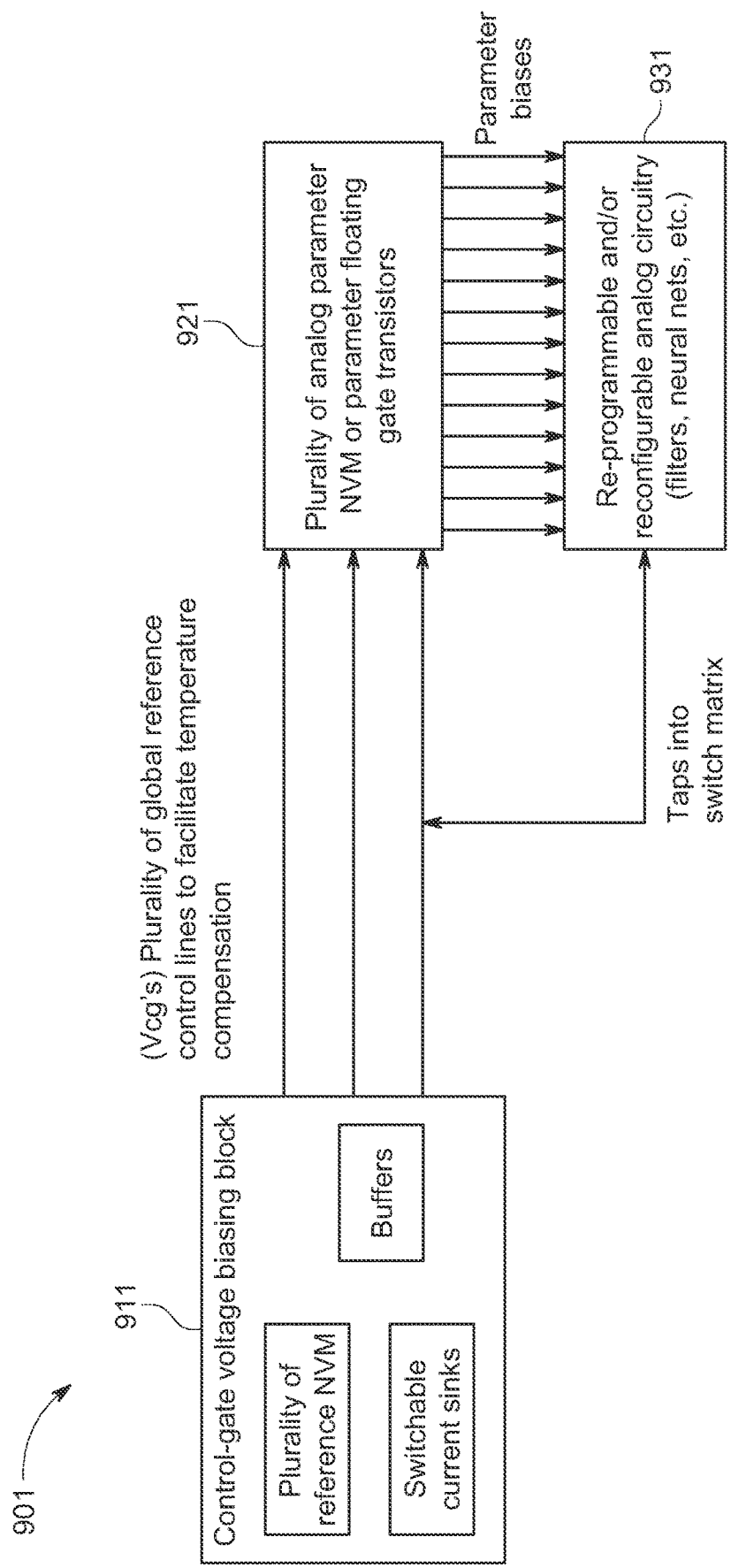

FIG. 9B is another high-level block diagram illustrating an architecture of a system 901 according to some embodiments. The system 901 includes a control-gate voltage biasing block 911 with a plurality of reference NVM, buffers, and switchable current sinks. The biasing block 911 provides a plurality of global reference control lines (to facilitate temperature compensation) to a plurality of analog parameter NVM or parameter floating gate transistors 921. Parameter biases can then be provided to re-programmable and/or reconfigurable analog circuitry 932 (e.g., filters, neural networks, etc.).

Figure 9C:
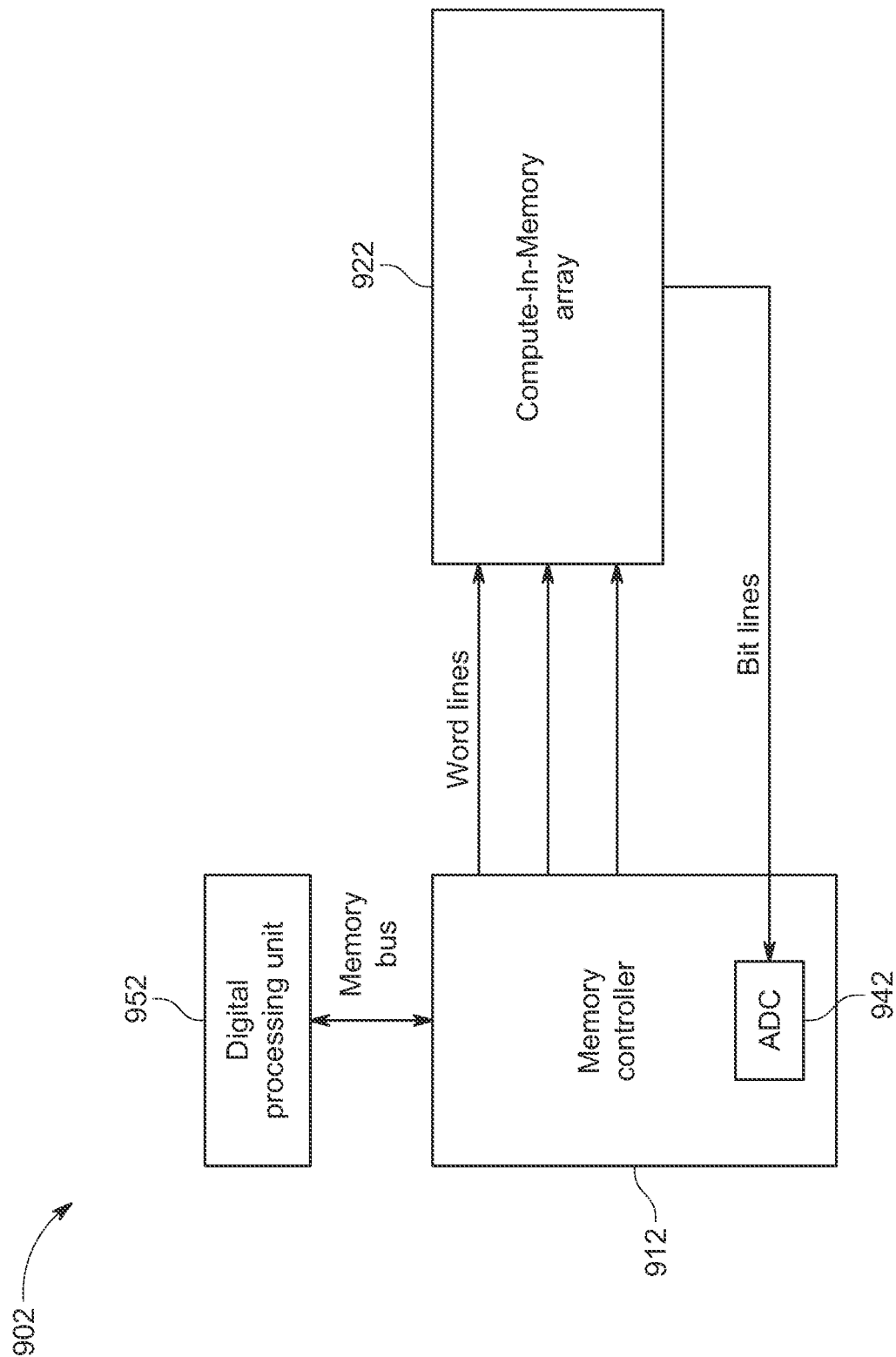

FIG. 9C is a high-level block diagram illustrating an architecture of a system 902 according to some embodiments. The system 902 includes a memory controller 912 (e.g., associated with the input path DAC, voltage-to-current-conversion, and reference floating-gate transistor circuits of FIG. 8) that provides a plurality of word lines (to facilitate temperature compensation) to a compute-in-memory array 922 (e.g., associated with the floating gate cells of FIG. 8). The input path, combined with ADC 942 readout bit lines, is essentially the memory controller 912 for the compute-in-memory array 922. Note that computation may happen in the process of reading from the compute-in-memory array 922 (since many addresses may be activated simultaneously and their stored values summed together). According to some embodiments, a digital processing unit 952 may sequence memory read operations such that a desired algorithm is performed. Note that the word lines from the memory controller 912 to the compute-in-memory array 922 may be associated with multiple word lines per word (with different temperature coefficients) to more accurately cancel the temperature dependence of the compute-in-memory array 922.

Figure 10:
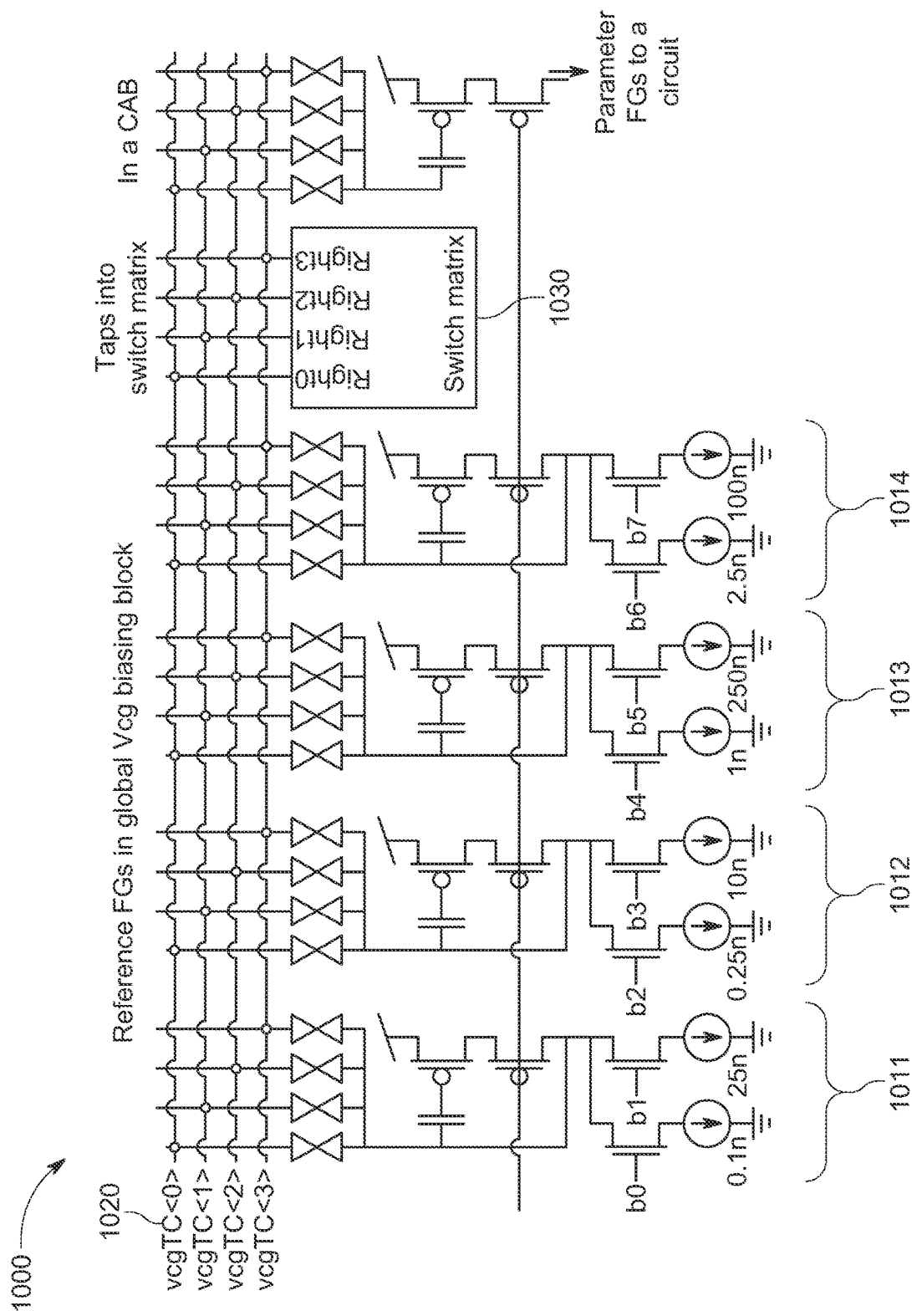
FIG. 10 is a more detailed system in accordance with some embodiments.

Some embodiments described herein use four reference floating-gate transistors. Each reference floating-gate transistor may be connected to one of four global reference control lines, and all the parameter floating-gate transistors can be multiplexed to the appropriate global control line. For example, FIG. 10 is a more detailed system 1000 in accordance with some embodiments. The system has four reference floating-gate transistors 1011, 1012, 1013, 1014 and four global reference control lines 1020 ($V_{GC0}$ through $V_{CG3}$). The global reference control lines may tap into a switch matrix 1030 for adaptive control or observation.

Selection of the current values for the reference floating-gate transistors 1011, 1012, 1013, 1014, as well as selection of which parameter floating-gate transistor 1011, 1012, 1013, 1014 is connected to which global line 1020 is implemented by the software toolchain at compilation time. As a result, the difference between the stored charge on the parameter floating-gate transistors and the respective reference floating-gate transistors 1011, 1012, 1013, 1014 can be significantly reduced, which means that the parameter floating-gate transistors drain current will have less temperature dependence.

Note that using a single reference circuit to fan out to all parameter floating-gate devices will result in poor performance over a large range of currents. Using a unique temperature-independent current source, as well as a unique reference circuit, for each parameter floating-gate, would result in nearly idealized performance, but it is infeasible due to size, power, and design constraints. Embodiments described herein adjust the reference currents for the situation. Embodiments also provide multiple options for the reference currents, and the parameter floating-gate transistors can be multiplexed to the most-appropriate value. The result is significantly improved temperature characteristics (covering a wide range of currents) as compared to the single-reference scenario without the overhead and infeasibility of having unique references for each parameter floating-gate transistor. Moreover, embodiments may provide on-chip configurability such that the reference and parameter floating-gate transistors do not need to be hardwired (but instead can be electronically selected). In addition, embodiments may provide software that is able to select the correct reference device/current.

The $V_{CG}$ biasing block 1020 consists of a set of four reference floating-gates 1011, 1012, 1013, 1014 that are in an array (the same as used throughout the core). In run-mode, their gates and drains connect to switchable current sinks so that they can be biased at different values. The four reference floating-gates 1011, 1012, 1013, 1014 are not hardwired to particular global $V_{CG}$ lines 1020 and can be connected to the most appropriate choice (as can be done with the parameter floating-gates in the array). Also, in some embodiments it is possible to obtain other current values by connecting two reference floating-gates to the same $V_{CG}$ (but only programming one of the floating-gates so that the currents of two biasing blocks can be used).

The $V_{CG}$ lines still connect to the switch matrix 1030 and the reference currents are mirrored off of the main reference current. Each reference floating-gate transistor 1011, 1012, 1013, 1014 gets the choice of two of the reference currents. Each $V_{CG}$ is distributed to all of the floating-gates 1011, 1012, 1013, 1014 and also connect to switch matrix 1030.

Figure 11:
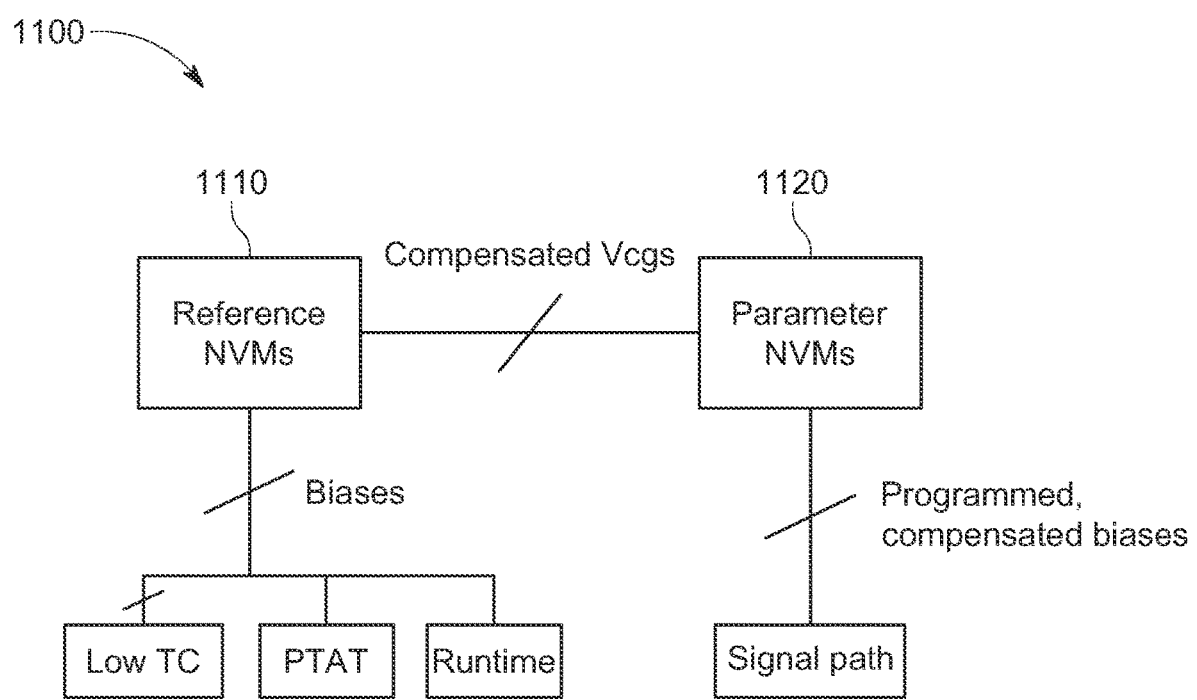
FIG. 11 illustrates multi-domain temperature compensation for analog Non-Volatile Memory ("NVM") according to some embodiments.
Figure 12:
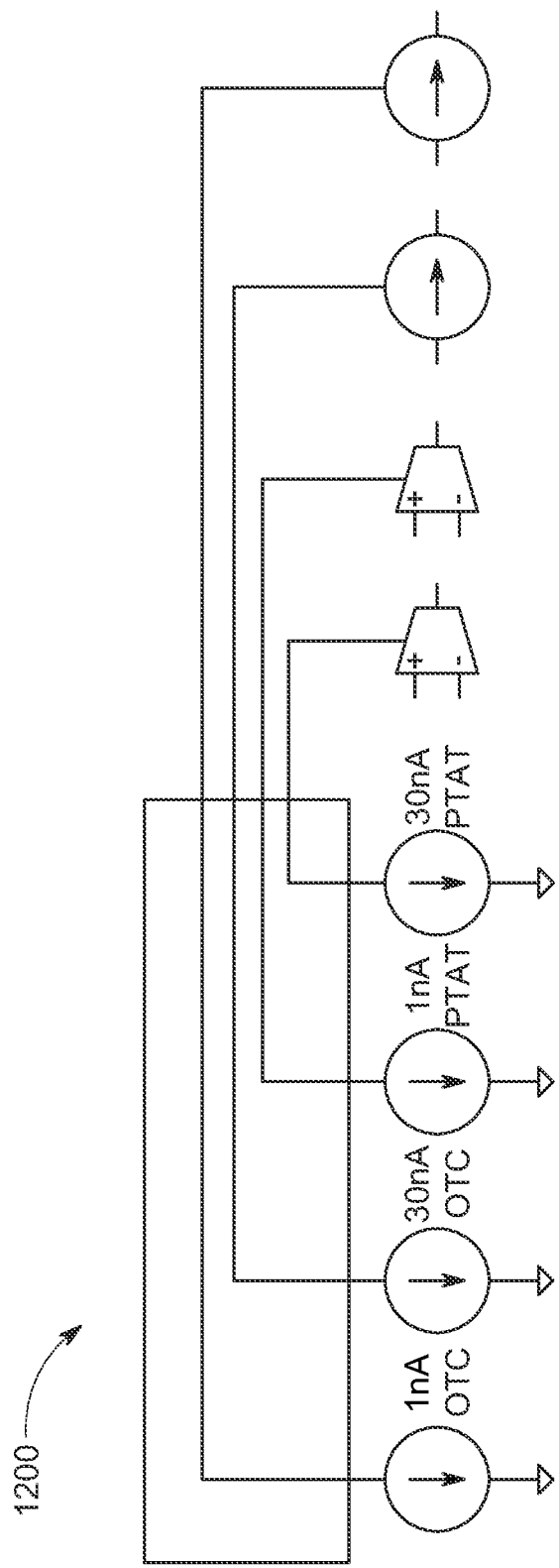
FIG. 12 is an example of biases in accordance with some embodiments.
Figure 13:
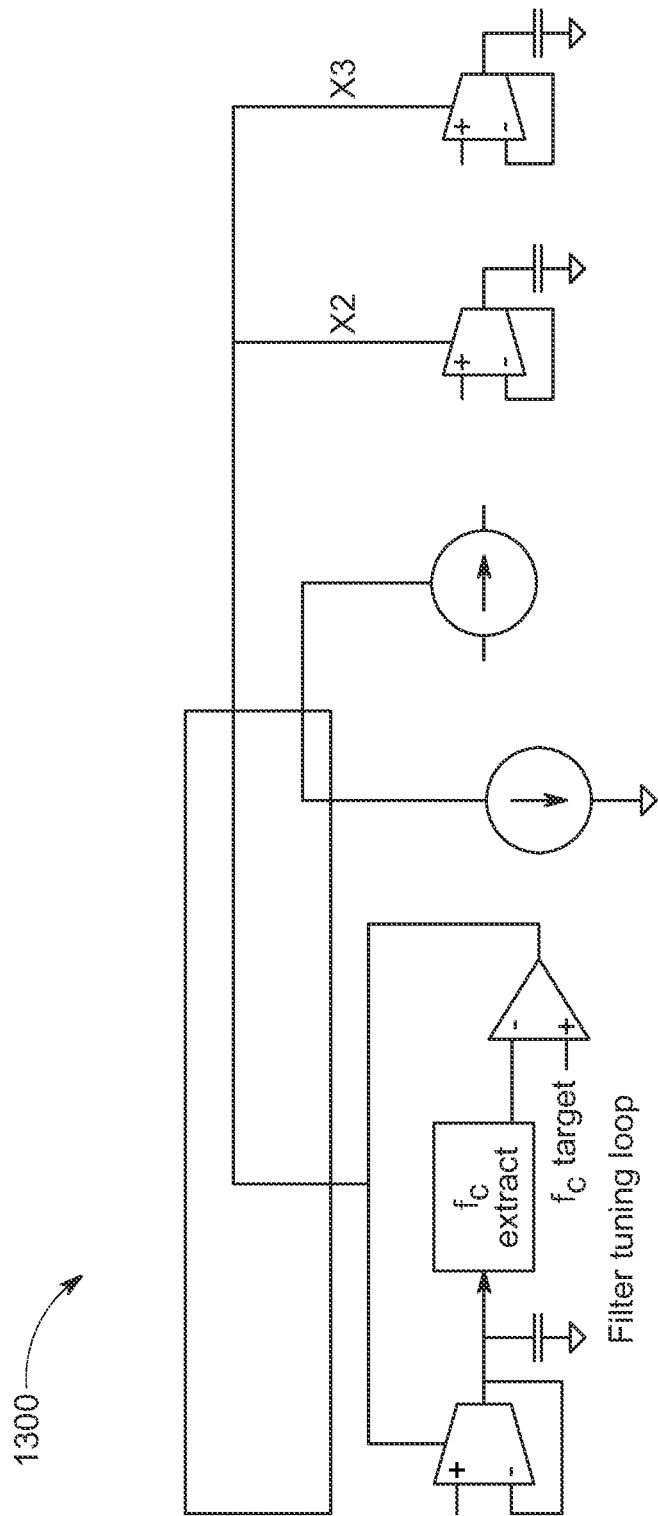
FIG. 13 is a tuning loop according to some embodiments.

FIG. 11 illustrates multi-domain temperature compensation 1100 for analog Non-Volatile Memory ("NVM") according to some embodiments. Reference NVMs 1110 may be associated with biases for a low Temperature Coefficient ("TC"), Proportional To Absolute Temperature ("PTAT"), runtime, etc. Mirror NVMs 1120 (e.g., hundreds or thousands of parameter NVMs 1120) may be associated with programmed, compensated biases for control parameters in the signal path. Some embodiments may have, for example, eight PTAT biases and four inputs from a switch matrix for arbitrary "runtime" inputs. Note that any bias types/TCs can be designed in a framework according to some embodiments. For example, PTAT may be preferred to bias transconductors while "zero TC" (or 0TC) may be preferred to bias current sources as illustrated in the circuit 1200 of FIG. 12 in accordance with some embodiments. Moreover, biases may be tuned continuously (e.g., in a loop) to compensate for circuit-specific variations in temperature, VDD, resistance, capacitance, etc. FIG. 13 is a tuning loop 1300 in which a center frequency ($f_c$) is extracted according to some embodiments. Note that the tuning loop 1300 can be associated with different multipliers (×2, ×3, etc.) by adjusting the reference-to-parameter NVM values.

Figure 14:
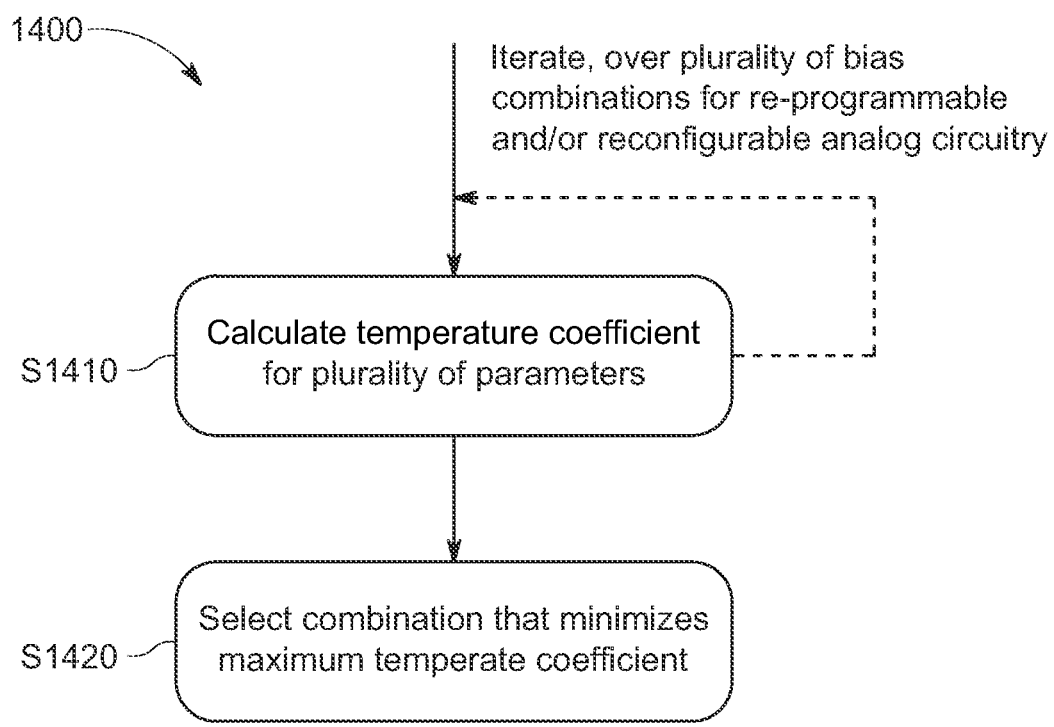
FIG. 14 is a temperature compensation method in accordance with some embodiments.

According to some embodiments, the most appropriate biases for an application are chosen and an analog parameter NVM can scale (or fine tune) the biases for run-time circuits. That is, to configure a part, a set of biases may be selected based on the specific application. FIG. 14 is a temperature compensation method 1400 in accordance with some embodiments. The method 1400 may iterate over a plurality of bias combinations for re-programmable and/or reconfigurable analog circuitry (as illustrated by the dashed arrow in FIG. 14). For each iteration, the system calculates a temperature coefficient for a plurality of parameters at S1410. When all iterations are complete, the system selects the combination that minimizes the maximum TC at S1420. Note that other cost functions may be used (e.g., to minimize an average TC, weight various TCs of important parameters in the application, minimize the TC of a modeled detection accuracy, etc.). Similarly, other optimizers might be used.

Referring again to FIG. 11, each parameter NVM 1120 may be assigned to a reference NVM 1110, and the same logic may be used during bias selection. For example, assignments may be made such that a charge difference ($|Q_{ref} - Q_{param}|$) is minimized according to floating-gate transistor behavior across all operating regions:

$$I_{ref:param} = \alpha 2n(1 + e^{\beta(Q_{ref:param}C_{total} - VT)})^2$$

Figure 15:
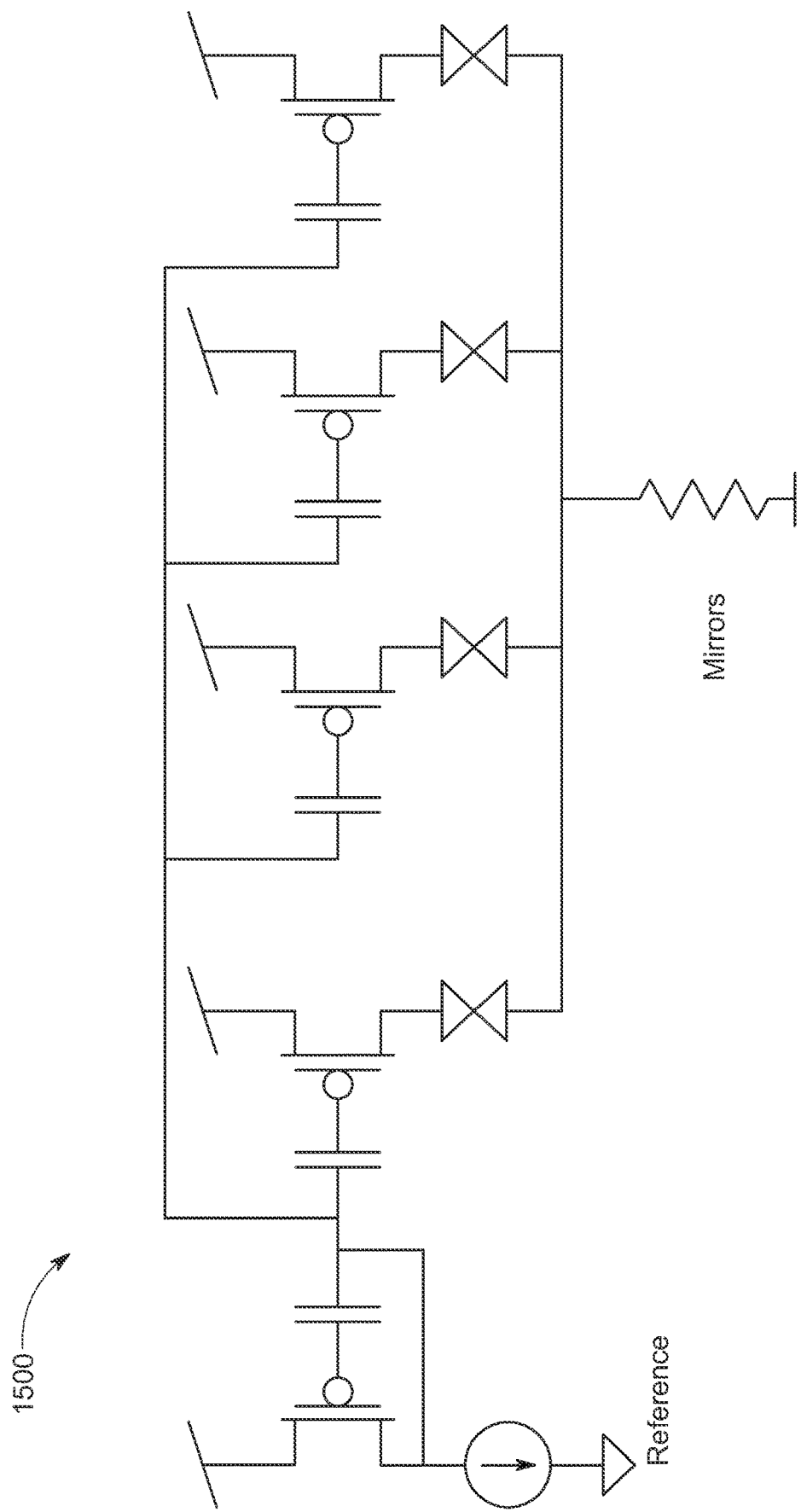
FIG. 15 illustrates reference calibration biasing according to some embodiments.

In addition, a charge difference may be computed from a reference calibration measurement for later use. FIG. 15 illustrates calibration biasing 1500 according to some embodiments. For each reference floating-gate, the system may measure a plurality of linked parameter floating-gates set with equal charge as the reference. A charge correction may be computed from this measurement such that adding the charge correction to the charge of each parameter NVM connected to that reference cancels device mismatch due to manufacturing or uneven write/erase aging. System configuration steps may keep track of parameter-to-reference assignment to apply the charge correction consistently for all permutations of the network, especially when only a subset of the network is in use.

Figure 17:
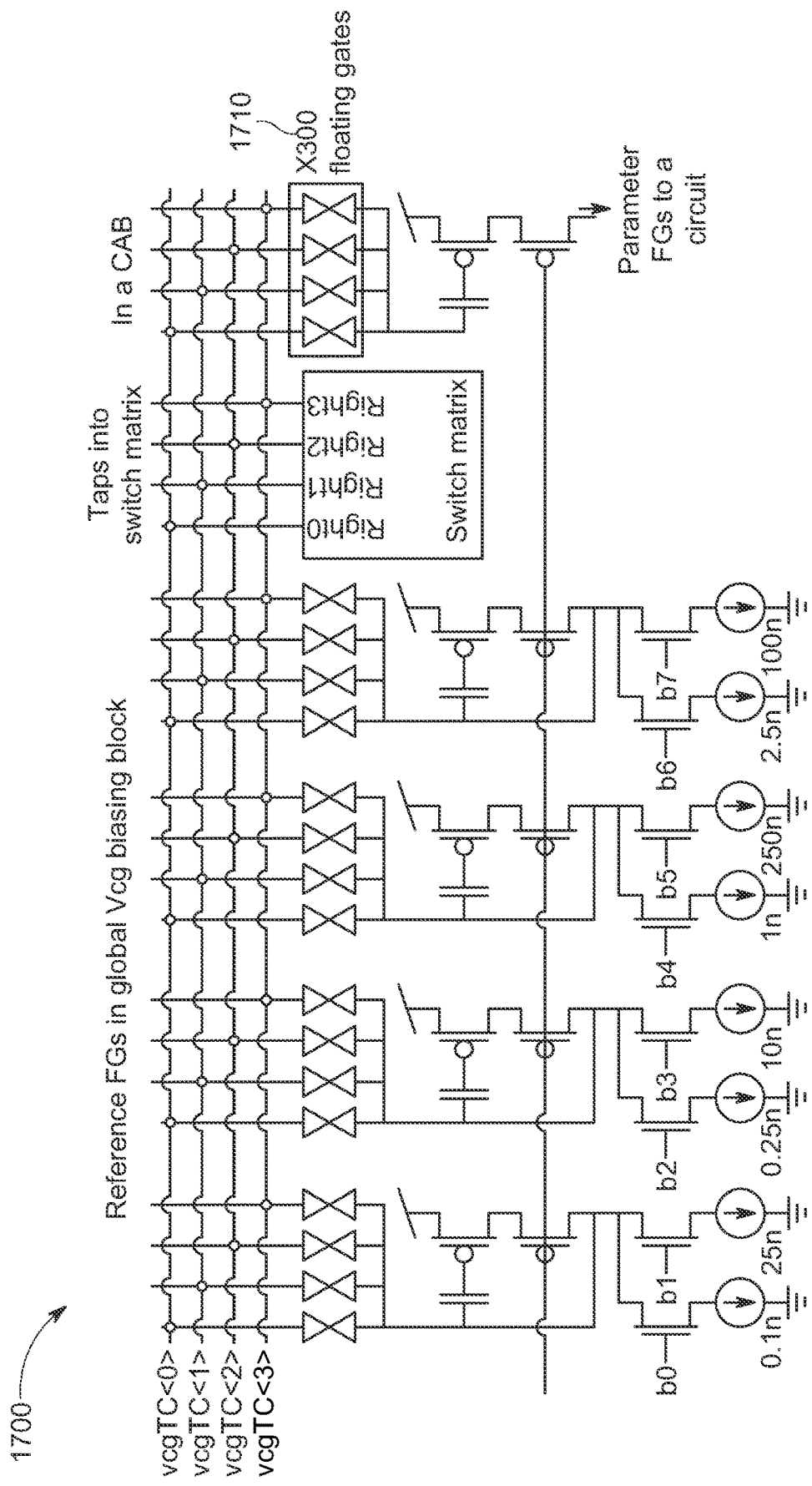
FIG. 17 is a circuit with multiple floating gates illustrating parasitics from a large number of switches according to some embodiments.
Figure 18:
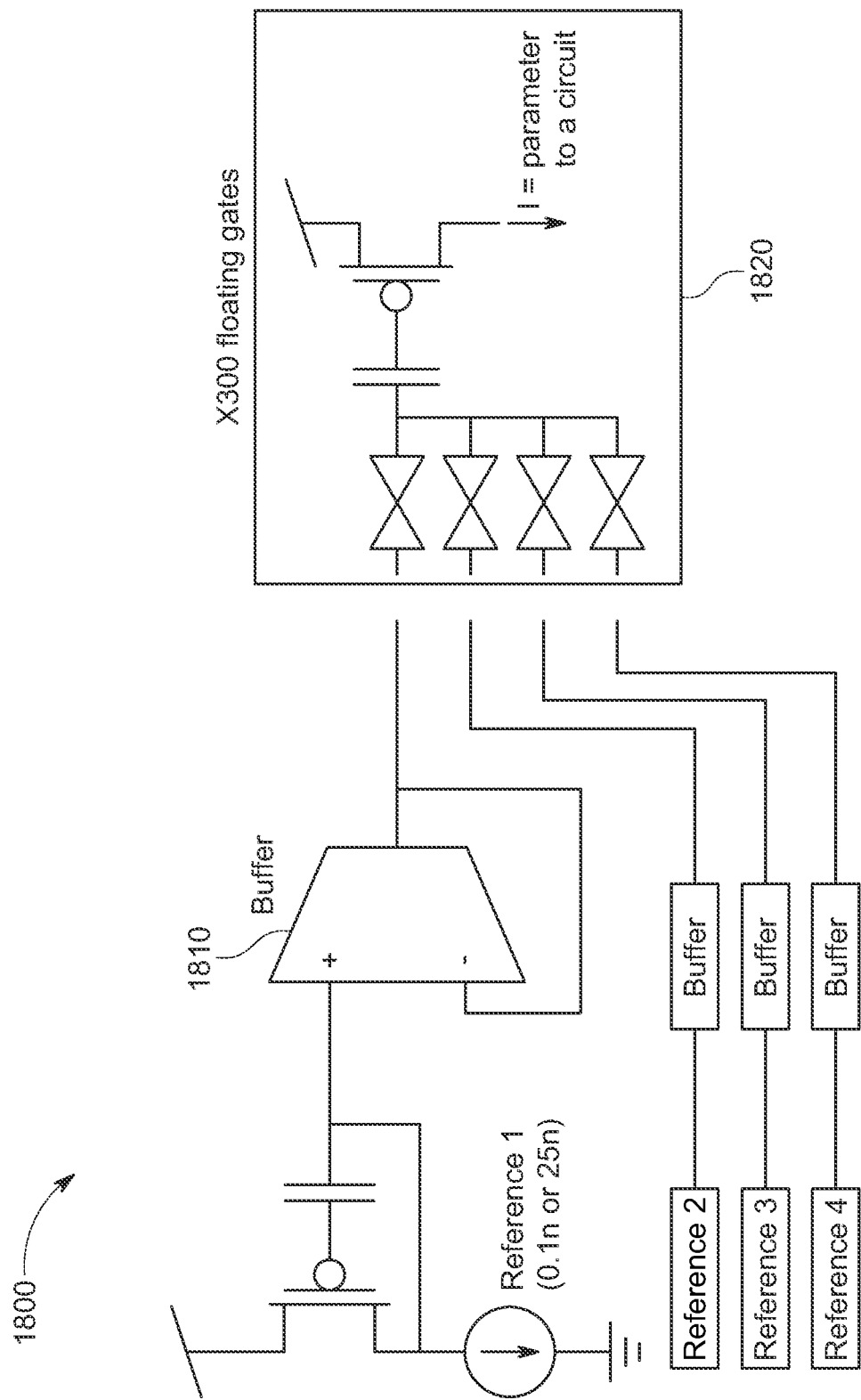
FIG. 18 illustrates use of a buffer to isolate high-temperature switch leakage in accordance with some embodiments.
Figure 19:
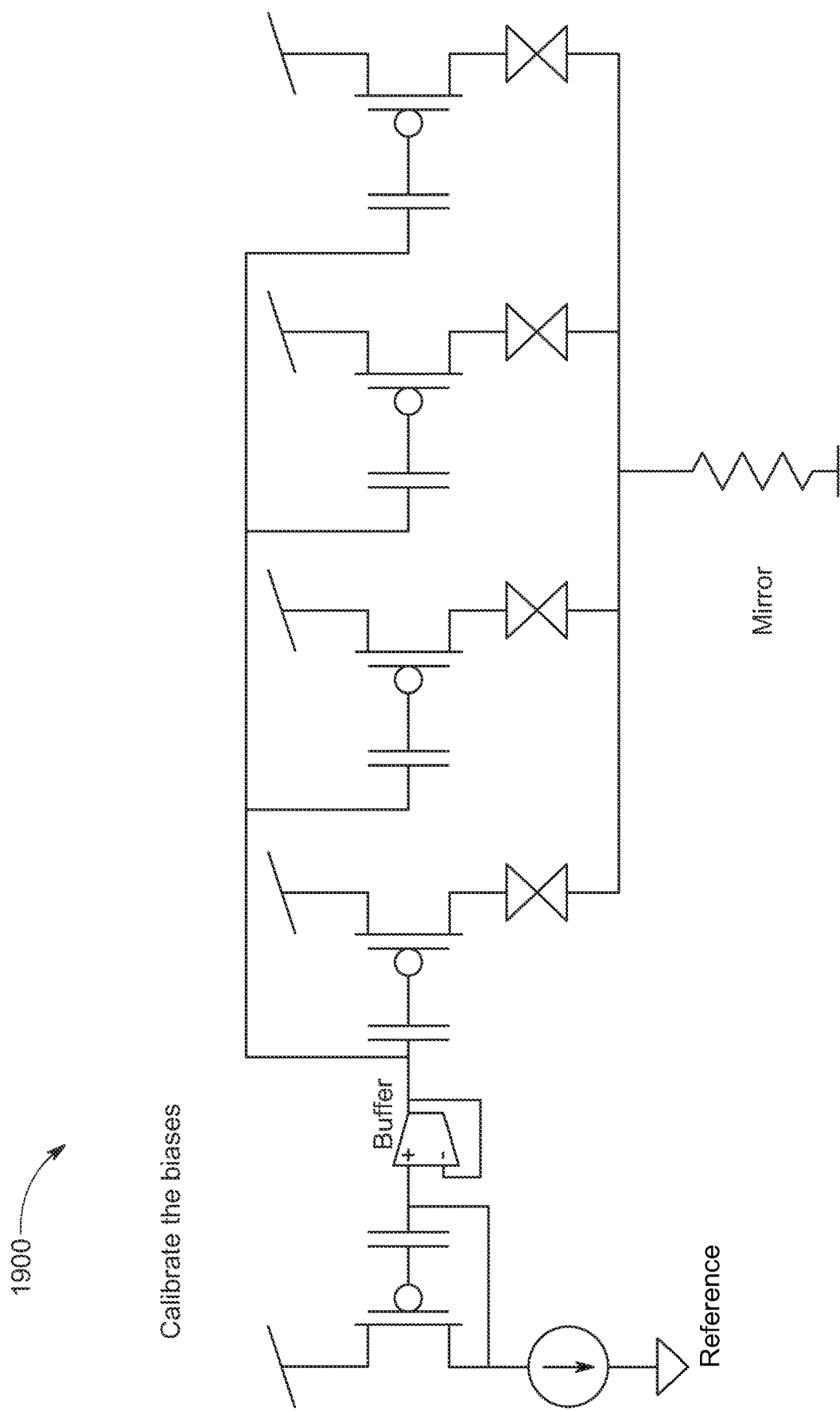
FIG. 19 is a circuit for reference bias calibration according to some embodiments.

Some embodiments may utilize over 300 parameter floating-gate transistors connected to a reference via four t-gate switches. In this case, leakage currents through the approximately 1,200 switches (which include 2,400 transistors) may begin to dominate the reference current at higher temperatures. This issue maybe exacerbated when using lower reference currents. For example, FIG. 16 is a graph 1600 showing control line leakage current over a range of temperatures, exceeding typical reference currents at high temperatures, in accordance with some embodiments and FIG. 17 is a circuit 1700 with three hundred parameter floating gates 1710 according to some embodiments. To address temperature-induced leakage, a reference floating-gate transistor may be buffered before connecting to the switches to allow for temperature compensation reference selection. For example, FIG. 18 illustrates 1800 the use of a buffer 1810 prior to signals being sent to three hundred parameter floating gates 1820 in accordance with some embodiments. This allows for the reference to operate at the correct bias, with the buffer sourcing the current needed to overcome the leakage from the switches. Moreover, when such a buffer is added, additional offset may be introduced into the temperature compensation circuit. This offset can cause a mismatch between the reference and the parameter floating gate transistors and cause a degradation of the temperature coefficient. FIG. 19 is a circuit 1900 for bias calibration according to some embodiments. The calibration step may be done with the buffers in the loop. As a result, when the primary reference's charge is modified, the offset introduced by the buffer can be taken into consideration.

Figure 20:
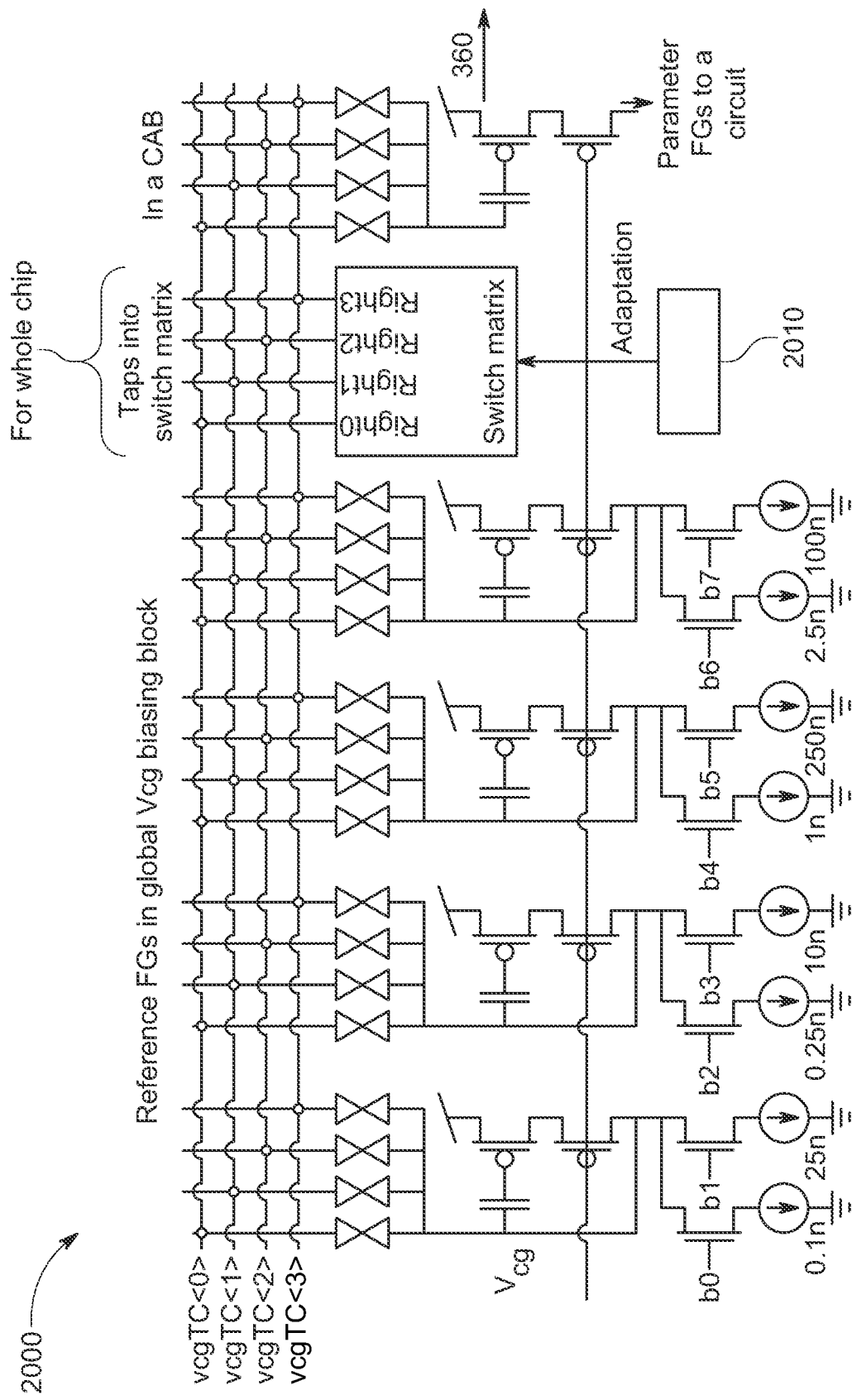
FIG. 20 is a circuit showing control line adaptation according to some embodiments.
Figure 21:
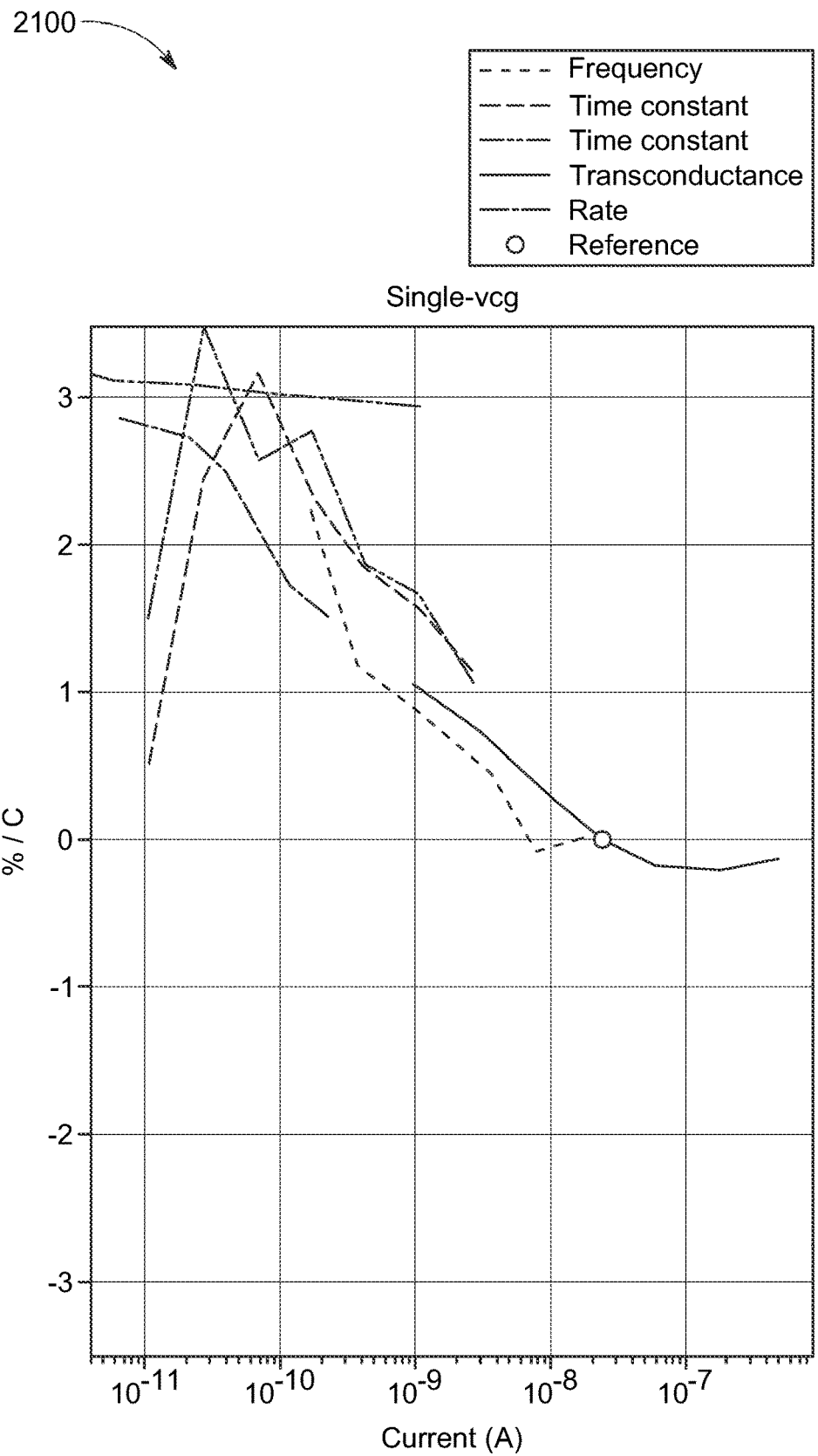
FIG. 21 is a single $V_{CG}$ measured temperature-coefficient graph according to some embodiments.
Figure 22:
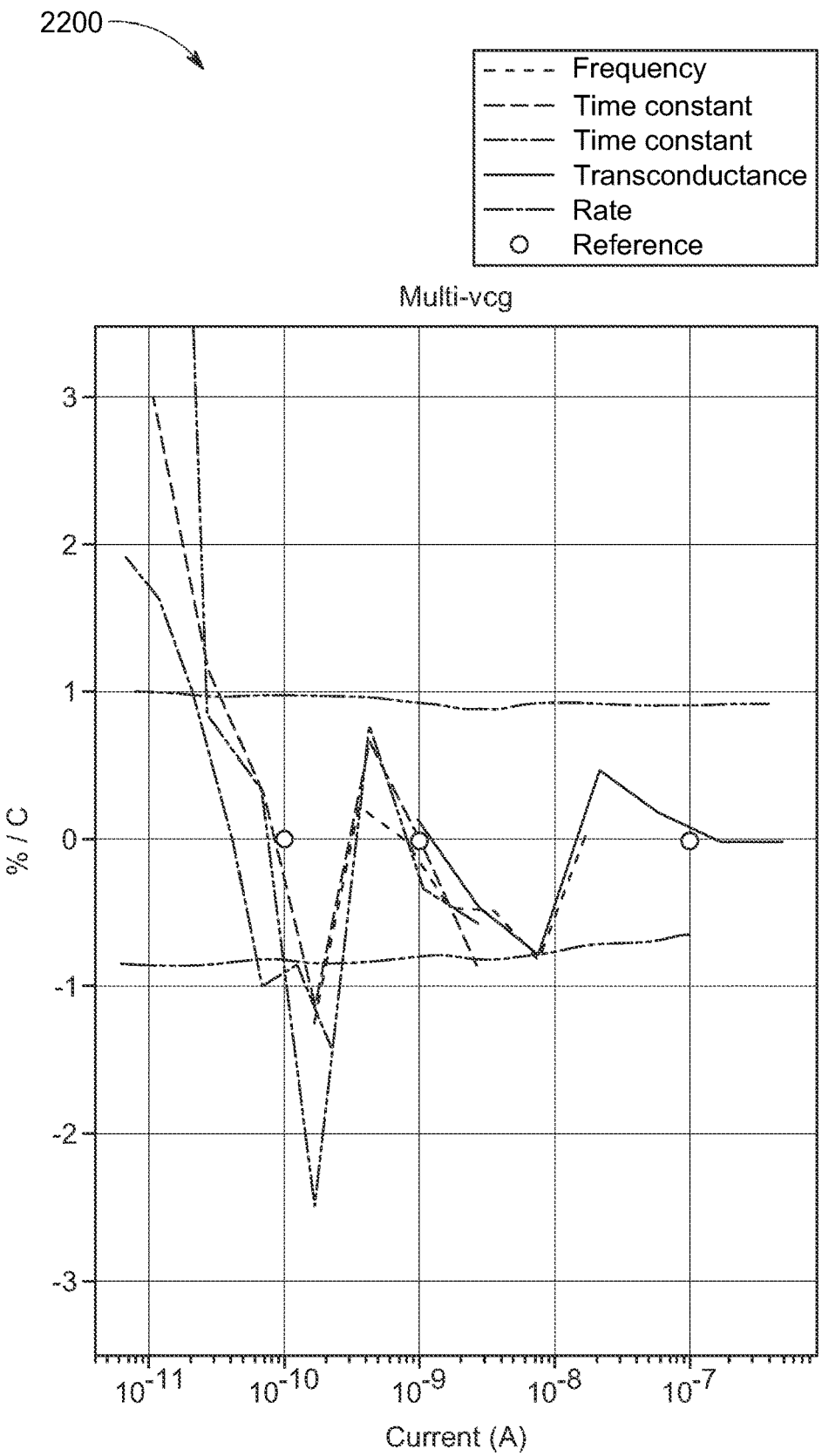
FIG. 22 is a multi-$V_{CG}$ measured temperature-coefficient graph in accordance with some embodiments.

FIG. 20 is a circuit 2000 showing an adaptation element 2010 according to some embodiments. The adaptation is fed back to a global reference control line from the re-programmable and/or reconfigurable analog circuitry. For example, the analog circuitry may be reconfigured via a switch matrix and the global reference control line may be controlled through the switch matrix. Since multiple control gate lines are available, a subset of the parameter NVM may be dynamically adapted while the rest are controlled by constant references, or multiple subsets of parameter NVM may be adapted differently. For example, the adaptation signal may be inversely proportional to a computed magnitude of an input feature vector, and the adapted control line may control the weight parameters of the input layer of a neural network, such that the weight parameters are adapted to normalize the feature vector at any given moment. FIG. 21 is a single $V_{CG}$ measured temperature-coefficient graph 2100 according to some embodiments while FIG. 22 is a multi- $V_{CG}$ measured temperature-coefficient graph 2200 in accordance with some embodiments.

As used herein, the term "FPAA" may refer to, for example, any device that contains re-programmable and/or re-configurable analog circuitry. The device may also be augmented with re-programmable and/or re-configurable digital circuitry. The circuitry may be typically arranged in a re-configurable matrix of re-programmable circuit blocks. Note, however, that other architectures may also be within the spirit of this invention, such as architectures that are re-programmable but not re-configurable, architectures that are re-configurable but not re-programmable, architectures in which the circuit blocks are re-configurable (and thus are not placed in a re-configurable matrix), and/or architectures in which the re-configurable matrix itself is re-programmable. Furthermore, a matrix of circuit blocks may be scaled to any size and may consist of identical or varying types of circuit blocks. The function of the device may be modified to provide various capabilities such as sensor interfacing, signal conditioning, signal processing, event detection, wake-up generation, etc.

Embodiments have been described herein solely for the purpose of illustration. Persons skilled in the art will recognize from this description that embodiments are not limited to those described but may be practiced with modifications and alterations limited only by the spirit and scope of the appended claims.

What is claimed is:

1. A system, comprising:
   a memory controller; and
   at least one analog compute-in-memory array connected to a plurality of word lines of the memory controller, with multiple word lines per word being associated with different temperature coefficients, to facilitate temperature compensation of the compute-in-memory array.

2. The system of claim 1, wherein there are a plurality of analog compute-in-memory arrays and each is configurable to be connected to a plurality of word lines to individually facilitate temperature compensation.

3. The system of claim 1, wherein the analog compute-in-memory array is associated with parameter floating-gate transistors.

4. The system of claim 1, wherein the analog compute-in-memory array is programmed to several orders of parameter magnitude.

5. The system of claim 1, wherein the analog compute-in-memory array is programmed to different amounts of charge.

6. The system of claim 1, wherein a software toolchain at model load time selects: (i) which parameter floating-gate transistor is connected to which word line, and (ii) a charge value for each parameter floating-gate transistor based on the selected word line.

7. The system of claim 1, wherein the plurality of word lines are driven by a temperature compensated digital-to-analog converter.

8. The system of claim 7, wherein two different parameter floating-gate transistors can be connected to the same $V_{CG}$.

9. The system of claim 1, wherein the system includes reference non-volatile memories and a plurality of parameter non-volatile memories with programmed, compensated weights.

10. The system of claim 1, wherein multiple parameter floating-gate transistors are connected via their drains to combine temperature profiles, programmed to generate currents with opposing temperature coefficients to better cancel the temperature dependence when operating in the regions between $V_{CG}$ values generated by reference floating-gate transistors.

11. The system of claim 1, wherein the system requires dynamic control defined by temperature coefficient points for the connected word lines.

12. A method, comprising:
    providing a memory controller for a system; and
    facilitating temperature compensation for at least one analog compute-in-memory array via a plurality of word lines of the memory controller, with multiple word lines per word being associated with different temperature coefficients.

13. The method of claim 12, wherein there are a plurality of analog compute-in-memory arrays and each is configurable to be connected to a plurality of word lines to individually facilitate temperature compensation.

14. The method of claim 12, wherein the analog compute-in-memory array is associated with parameter floating-gate transistors.

15. The method of claim 12, wherein the analog compute-in-memory array is programmed to several orders of parameter magnitude.

16. The method of claim 12, wherein the analog compute-in-memory array is programmed to different amounts of charge.

17. The method of claim 12, wherein a software toolchain at model load time selects: (i) which parameter floating-gate transistor is connected to which word line, and (ii) a charge value for each parameter floating-gate transistor based on the selected word line.

18. The method of claim 12, wherein the plurality of word lines are driven by a temperature compensated digital-to-analog converter.

19. The method of claim 18, wherein two different parameter floating-gate transistors can be connected to the same $V_{CG}$.

20. The method of claim 12, wherein the system includes reference non-volatile memories and a plurality of parameter non-volatile memories with programmed, compensated weights.

21. The method of claim 12, wherein multiple parameter floating-gate transistors are connected via their drains to combine temperature profiles, programmed to generate currents with opposing temperature coefficients to better cancel the temperature dependence when operating in the regions between $V_{CG}$ values generated by reference floating-gate transistors.

22. The method of claim 12, wherein the system requires dynamic control defined by temperature coefficient points for the connected word lines.

* * * * *